United States Patent
Lee

(10) Patent No.: US 10,424,594 B2
(45) Date of Patent: *Sep. 24, 2019

(54) METHODS OF FORMING A THIN FILM AND METHODS OF FABRICATING A SEMICONDUCTOR DEVICE INCLUDING USING THE SAME

(71) Applicant: Samsung Electronics Co., Ltd., Gyeonggi-do (KR)

(72) Inventor: Dongkak Lee, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 178 days.

This patent is subject to a terminal disclaimer.

(21) Appl. No.: 14/986,383

(22) Filed: Dec. 31, 2015

(65) Prior Publication Data

US 2016/0118401 A1    Apr. 28, 2016

Related U.S. Application Data

(63) Continuation of application No. 13/721,598, filed on Dec. 20, 2012, now Pat. No. 9,257,305.

(51) Int. Cl.

| | |
|---|---|
| *H01L 21/76* | (2006.01) |
| *H01L 27/11582* | (2017.01) |
| *H01L 21/02* | (2006.01) |
| *H01L 21/762* | (2006.01) |
| *H01L 21/763* | (2006.01) |
| *H01L 27/108* | (2006.01) |
| *H01L 27/24* | (2006.01) |

(52) U.S. Cl.
CPC .... *H01L 27/11582* (2013.01); *H01L 21/0262* (2013.01); *H01L 21/02381* (2013.01); *H01L 21/02645* (2013.01); *H01L 21/02658* (2013.01); *H01L 21/76* (2013.01); *H01L 21/763* (2013.01); *H01L 21/76224* (2013.01); *H01L 27/10894* (2013.01); *H01L 27/2409* (2013.01); *H01L 27/2436* (2013.01)

(58) Field of Classification Search
CPC .......... H01L 29/11582; H01L 21/0262; H01L 21/02381; H01L 21/0245; H01L 21/02532; H01L 21/02645; H01L 21/02658; H01L 21/762; H01L 21/768
USPC ................ 438/400, 424, 425, 429, 430, 431
See application file for complete search history.

(56) References Cited

U.S. PATENT DOCUMENTS

| | | |
|---|---|---|
| 5,001,081 A | 3/1991 | Tuntasood et al. |
| 5,244,823 A | 9/1993 | Adan |
| 5,433,787 A | 7/1995 | Suzuki et al. |

(Continued)

FOREIGN PATENT DOCUMENTS

| | | |
|---|---|---|
| JP | H05163573 A | 6/1993 |
| JP | H0817744 A | 1/1996 |

(Continued)

*Primary Examiner* — Vu A Vu
(74) *Attorney, Agent, or Firm* — Sughrue Mion, PLLC

(57) ABSTRACT

Provided are methods of forming a thin film and methods of fabricating a semiconductor device including the same. The thin film forming methods may include supplying an organic silicon source to form a silicon seed layer on a lower layer, the silicon seed layer including silicon seed particles adsorbed on the lower layer, and supplying an inorganic silicon source to deposit a silicon film on the lower layer adsorbed with the silicon atoms.

19 Claims, 21 Drawing Sheets

(56) References Cited

U.S. PATENT DOCUMENTS

| | | | |
|---|---|---|---|
| 5,585,148 A | | 12/1996 | Suzuki et al. |
| 5,646,061 A | | 7/1997 | Wang et al. |
| 6,927,138 B2 | * | 8/2005 | Takenaka .......... H01L 21/76229 |
| | | | 257/E21.548 |
| 6,930,018 B2 | | 8/2005 | Mehrad et al. |
| 7,524,732 B2 | | 4/2009 | Pan et al. |
| 7,696,106 B2 | | 4/2010 | Okada et al. |
| 9,257,305 B2 | * | 2/2016 | Lee .......................... H01L 21/36 |
| 2003/0011019 A1 | * | 1/2003 | Inoue ................ H01L 21/28211 |
| | | | 257/314 |
| 2003/0107082 A1 | * | 6/2003 | Kim ........................ H01L 21/84 |
| | | | 257/347 |
| 2004/0036142 A1 | * | 2/2004 | Shima ............... H01L 21/76224 |
| | | | 257/510 |
| 2004/0121554 A1 | * | 6/2004 | Ohnishi ............ H01L 21/76224 |
| | | | 438/429 |
| 2005/0112840 A1 | | 5/2005 | Doong et al. |
| 2005/0247994 A1 | | 11/2005 | Mehrad et al. |
| 2008/0209381 A1 | | 8/2008 | Doong et al. |
| 2009/0273052 A1 | * | 11/2009 | Chuang ........... H01L 21/823412 |
| | | | 257/506 |
| 2010/0252907 A1 | | 10/2010 | Doong et al. |
| 2012/0028437 A1 | * | 2/2012 | Watanabe ......... H01L 21/02164 |
| | | | 438/425 |
| 2013/0023110 A1 | | 1/2013 | Kakimoto et al. |

FOREIGN PATENT DOCUMENTS

| | | |
|---|---|---|
| KR | 1020050112662 A | 12/2005 |
| KR | 1020080039113 A | 5/2008 |
| KR | 10-0878498 B1 | 1/2009 |
| KR | 20090012113 A | 9/2009 |

\* cited by examiner

METHODS OF FORMING A THIN FILM AND METHODS OF FABRICATING A SEMICONDUCTOR DEVICE INCLUDING USING THE SAME

CROSS-REFERENCE TO RELATED APPLICATIONS

This application is a continuation of and claims priority to U.S. U.S. application Ser. No. 14/721,598, filed on Dec. 20, 2012, which claims priority under 35 U.S.C. § 119 to Korean Patent Application No. 10-2011-0140384, filed on Dec. 22, 2011, in the Korean Intellectual Property Office, the entire contents of each are hereby incorporated by reference.

FIELD OF THE INVENTION

Embodiments of the inventive concept relate to methods of forming a thin film and methods of fabricating a semiconductor device including the same, and more particularly, to methods of forming a thin silicon film and methods of fabricating a semiconductor device including the same.

BACKGROUND OF THE INVENTION

Higher integration of semiconductor memory devices is desired to satisfy the increasing demands of the electronic industry. Down-scaling can be an important and effective way for achieving the higher integration of semiconductor memory devices and reducing the fabrication costs. However, down-sizing may lead to several problems, such as a decrease in process margin and/or an increasing difficulty in optimizing components (e.g., various driving circuits and/or memory cells) constituting the semiconductor device.

SUMMARY

Embodiments of the inventive concept provide methods of forming a layer having a decreased thickness.

Other embodiments of the inventive concept provide methods of fabricating a semiconductor device using the layer-forming method.

According to example embodiments of the inventive concept, a method of forming a thin film may include supplying an organic silicon source to form a silicon seed layer on a lower layer, the silicon seed layer including silicon seed particles adsorbed on the lower layer, and supplying an inorganic silicon source to deposit a silicon film on the lower layer adsorbed with the silicon seed particles.

In example embodiments, the silicon film may be formed to have a thickness ranging from about 1 nm to 10 nm.

In example embodiments, the silicon seed layer may be formed to have a thickness ranging from about 0.1 nm to 1.0 nm.

In example embodiments, the organic silicon source may be a silicon compound containing an amino group.

In example embodiments, the silicon film may be formed to have a poly-crystalline structure.

In example embodiments, forming the silicon seed layer may be performed at a first temperature, and the deposition of the silicon film may be performed at a second temperature higher than the first temperature.

In example embodiments, forming the silicon seed layer and the deposition of the silicon film may be performed in an in-situ manner.

According to example embodiments of the inventive concept, a method of fabricating a semiconductor device may include forming an expanded active region including an active pattern, which may be a portion of a semiconductor substrate defined by formation of trenches, and a silicon film covering inner walls of the trenches, forming a device isolation structure to fill the trenches provided with the silicon film, forming a conductive line to cross the expanded active region, and forming a doped region in the expanded active region at both sides of the conductive line.

In example embodiments, forming the expanded active region may include anisotropically etching the semiconductor substrate to form the trenches, supplying an organic silicon source to form a silicon seed layer including silicon seed particles adsorbed on the inner wall of the trench, and supplying an inorganic silicon source to deposit a polysilicon film on the inner wall of the trench adsorbed with the silicon seed particles.

In example embodiments, an upper width of the active pattern may be smaller than that of the trench.

In example embodiments, a top surface of the silicon film may be coplanar with that of the active pattern.

In example embodiments, the silicon film may be formed to extend from the inner wall of the trench to a top surface of the semiconductor substrate.

In example embodiments, the device isolation structure may be in direct contact with a bottom surface of the trench.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1A:
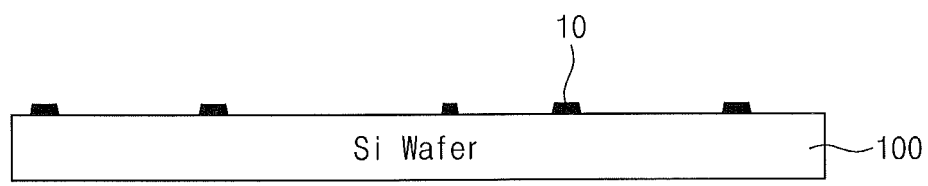
FIGS. 1A through 1D are diagrams exemplarily illustrating a method of forming a thin film according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. As used herein the term "about" preceding a value in a range applies to all other values in the range unless otherwise specified. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1A through 1D are diagrams exemplarily illustrating a method of forming a thin film according to example embodiments of the inventive concept.

Referring to FIG. 1A, a lower layer 100 may be provided as a base structure for forming semiconductor devices. There may be dangling bonds and defects 10 on a surface of the lower layer 100. The dangling bonds and the defects 10 may lead to generation of physical defects in a thin film, which may be formed subsequently on the lower layer 100, or on an interface thereof, thereby deteriorating surface morphology.

In example embodiments, the lower layer 100 may include at least one of semiconductor materials, conductive materials, insulating materials, or any combination thereof. For example, in the case in which the lower layer 100 is formed of a semiconductor material, the lower layer 100 may be, for example, a semiconductor wafer or an epitaxially grown semiconductor layer. In the case in which the lower layer 100 is formed of an insulating material, the lower layer 100 may be at least one of, for example, high density plasma (HDP) oxide, TetraEthyl OrthoSilicate (TEOS), Plasma Enhanced TEOS (PE-TEOS), $O_3$-TEOS, Undoped Silicate Glass (USG), PhosphoSilicate Glass (PSG), Borosilicate Glass (BSG), BoroPhosphoSilicate Glass (BPSG), Fluoride Silicate Glass (FSG), Spin On Glass (SOG), Tonen SilaZene (TOSZ) or any combination thereof. Alternatively, the lower layer 100 may include at least one layer of silicon nitride, silicon oxynitride or low-k dielectrics. Furthermore, in the case in which the lower layer 100 is formed of a conductive material, the lower layer 100 may be formed of polysilicon, metal silicides, metals, metal nitrides, or any combination thereof.

The lower layer 100 may be formed to have a single-layered structure or a multi-layered structure including a plurality of layers. For example, the lower layer 100 may include a plurality of stacked insulating layers and a conductive or semiconductor layer interposed between the insulating layers. Furthermore, the lower layer 100 may include at least one of a semiconductor pattern, a conductive pattern, and an insulating pattern.

Figure 1B:
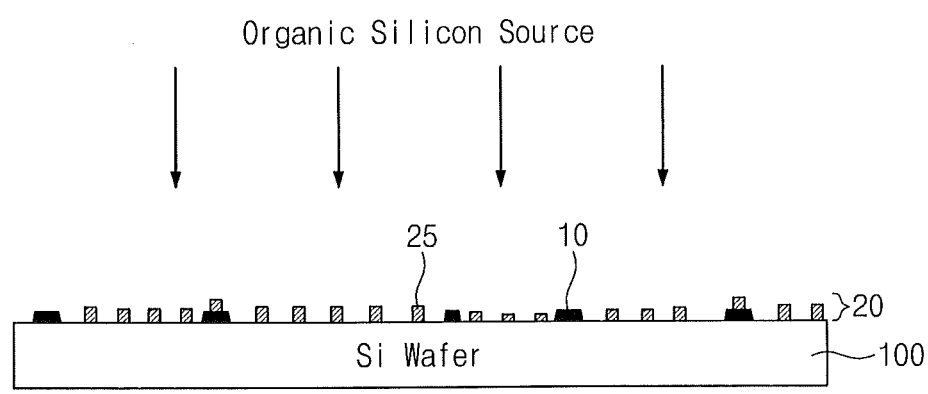

Referring to FIG. 1B, an organic silicon source material may be supplied on a surface of the lower layer 100. Accordingly, silicon seed particles 25 may be chemically adsorbed to the surface of the lower layer 100, which may include dangling bonds and defects 10 to form a silicon seed layer 20 consisting of silicon atoms. In example embodiments, the silicon seed layer 20 may be formed to have a thickness ranging from about 0.1 nm to about 1.0 nm.

In example embodiments, the organic silicon source material may be a silicon compound containing an amino group ($NH_2$). Alternatively, the organic silicon source material may be a silicon compound containing a hydrocarbon group ($C_xH_y$, where x and y are integers greater than or equal to one.) For example, the organic silicon source material may be one of BisTertButylAminoSilane (BTBAS), DiIsoPropylAminoSilane (DIPAS), BisDiEthylAminoSilane (BDEAS), BisEthylMethylAminoSilane (BEMAS), DiPropylAminoSilane (DPAS), DiEthylAminoSilane (DEAS), DiMethylAminoSilane (DMAS), BisDimethylAminoSilane (BDMAS), TrisDimethylAminoSilane (3DMAS), and tetrakis(DimethylAminoSilane) (4DMAS).

In example embodiments, supplying the organic silicon source material may be performed at a temperature ranging from about 300° C. to about 500° C. In addition, supplying the organic silicon source material may be performed for a duration ranging about 1 min to about 3 min.

Figure 1C:
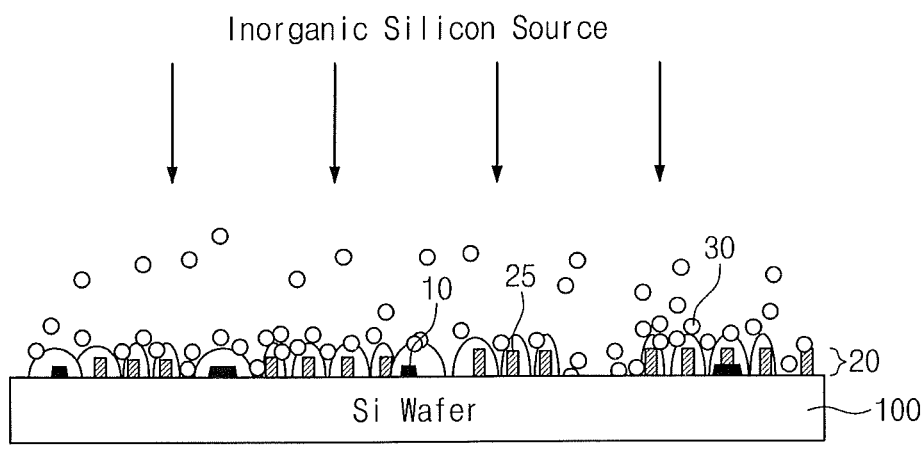
Figure 1D:
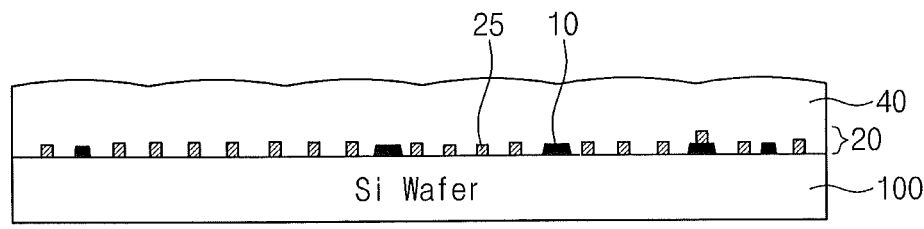

Referring to FIGS. 1C and 1D, an inorganic silicon source material may be supplied on the surface of the lower layer 100 provided with the silicon seed layer 20.

In the case of the absence of the silicon seed particles 25, the silicon layer may be formed from the inorganic silicon source material, but deposition thickness thereof may be greater than on dangling bonds and defects 10 and a surface diffusion speed of the inorganic silicon source material may become slow. For example, if an inorganic silicon source gas is continuously supplied onto the surface of the lower layer 100, the resulting silicon layer may have a greater thickness on the dangling bonds or the defects, i.e., there may be some difficulty in depositing a silicon layer having uniform thickness.

By contrast, according to example embodiments of the inventive concept, the silicon seed particles 25 are provided on the surface of the lower layer 100, and thus, silicon atoms 30 deposited from the inorganic silicon source material may be diffused with a fast surface diffusion speed. Accordingly, a silicon film 40 (as shown in FIG. 1D) may be formed to be thinner and more uniform than on the lower layer 100 adsorbed with the silicon seed particles 25. In other words, since a silicon film is formed by supplying an inorganic silicon source to a surface of the lower layer 100 adsorbed with the silicon seed particles 25, it is possible to form the silicon film 40 having improved thickness, uniformity and/or roughness, as shown in FIG. 1D. In example embodiments, the silicon film 40 may be formed to have a thickness ranging from about 1 nm to about 10 nm and have a polycrystalline structure. After formation of the polysilicon film 40, a thermal treatment process may be performed in such a way that the polysilicon film 40 can have a single crystalline structure.

In example embodiments, the inorganic silicon source may be a carbon-free silicon compound. For example, the inorganic silicon source may be one of $SiH_4$, $Si_2H_6$, $Si_3H_8$, $SiCl_4$, $SiCl_6$, $SiCl_2H_4$, and DCS ($SiCl_2H_2$).

In example embodiments, supplying of the inorganic silicon source may be performed at a temperature higher than that for the process of supplying the organic silicon source. For example, the inorganic silicon source may be supplied at a temperature ranging from about 600° C. to 800° C. A process time of supplying the inorganic silicon source into a chamber may be longer than that of supplying the organic silicon source, and, for example, range between 10 min and 30 min.

Figure 2A:
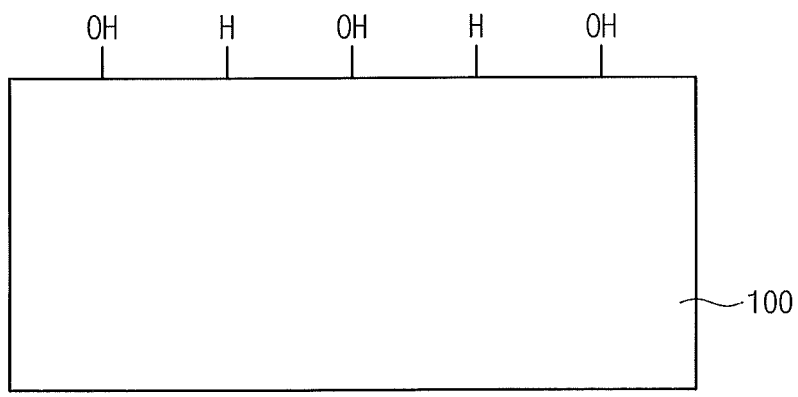
FIGS. 2A through 2C are diagrams schematically illustrating a method of forming a thin film according to example embodiments of the inventive concept.
Figure 2B:
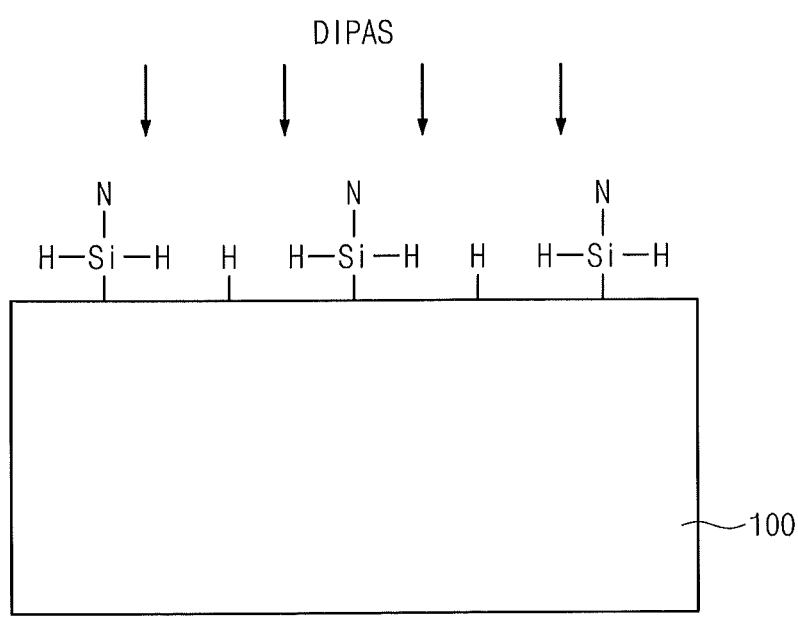
Figure 2C:
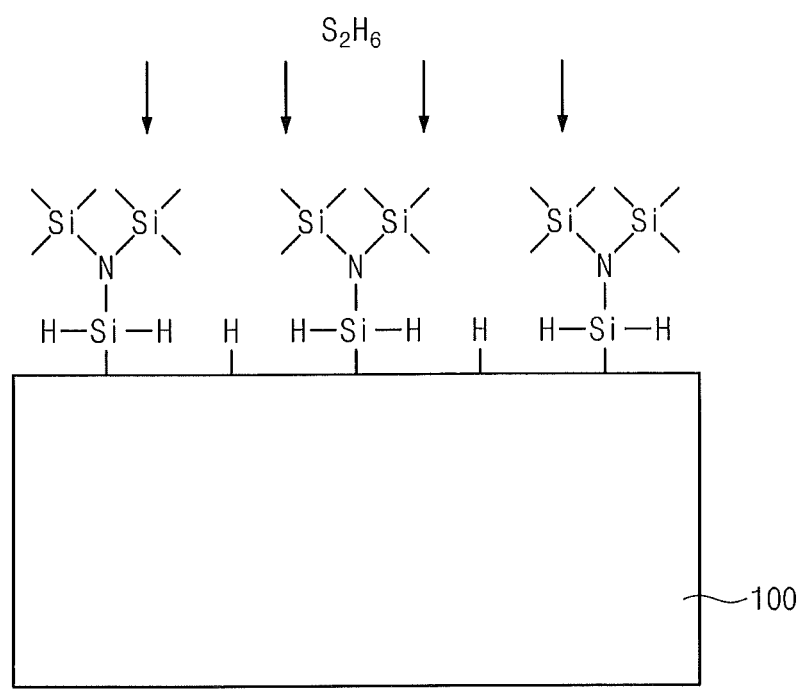

FIGS. 2A through 2C are diagrams schematically illustrating a method of forming a thin film according to example embodiments of the inventive concept.

According to example embodiments shown in FIG. 2A to FIG. 2C, the lower layer 100 may be a silicon substrate or silicon oxide. Referring to FIG. 2A, there may be dangling bonds and defects, which are not bonded with silicon atom, on a surface of the lower layer 100. For example, on the surface of the lower layer 100, there may be Si—OH defects and Si—H defects.

Referring to FIG. 2B, in example embodiments, an aminosilane, one of the organic silicon sources, may be provided onto the lower layer 100 provided with the dangling bonds and defects. For the sake of simplicity, the description that follows will refer to an example of the present embodiment in which DIPAS is used as the aminosilane. In the case in which the aminosilane is supplied onto the lower layer 100, the aminosilane may be chemically reacted with a hydroxyl group (—OH), existing on the surface of the lower layer 100 and an amino group may be chemically adsorbed on the surface of the lower layer 100.

A purging step and a thermal step of heating the substrate may be performed after providing the aminosilane compound. These steps enable removal of aminosilane that is not adsorbed on the surface of the lower layer 100 and the remaining silicon seed particles coupled with the amino group on the lower layer 100. In addition, by-products, which may be generated from a chemical reaction between the hydroxyl group and the aminosilane, may be removed during the purging and thermal steps.

Referring to FIG. 2C, the inorganic silicon source may be provided onto the lower layer 100 including the amino group. In example embodiments, the inorganic silicon source may be a gas including $Si_2H_6$. The gas including $Si_2H_6$ may be chemically reacted with the amino group ion on the lower layer 100 to form a layer of silicon atoms deposited on the lower layer 100. In other words, two silicon atoms may be coupled with one nitrogen atom to form a polysilicon film, whose thickness, uniformity and/or roughness are improved, on the lower layer 100. In example embodiments, the polysilicon film having a decreased thickness (e.g., about 1 nm to 10 nm) can be deposited using this method.

Figure 3A:
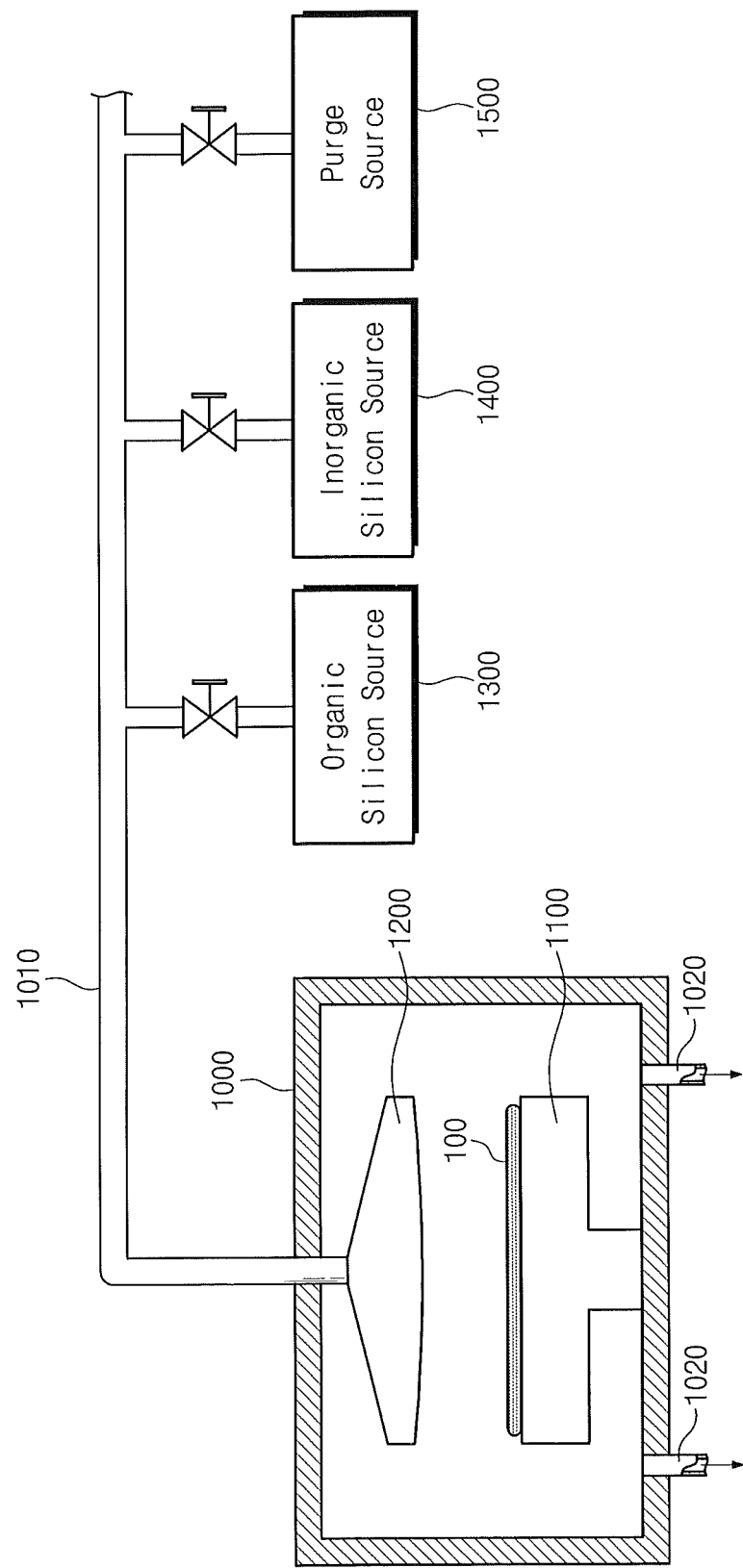
FIGS. 3A and 3B are schematic diagrams of apparatus for forming a thin film according to example embodiments of the inventive concept.
Figure 3B:
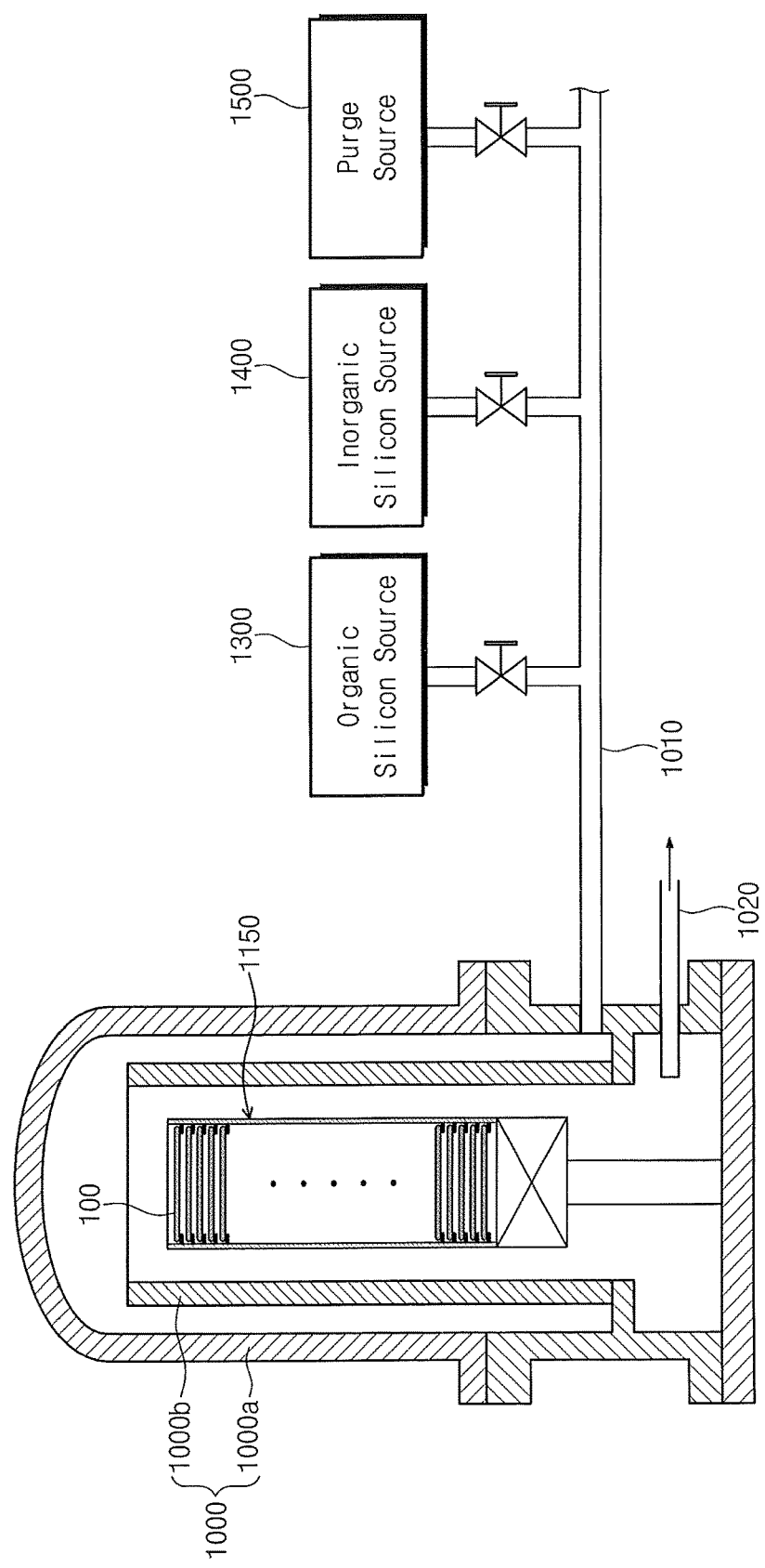

Hereinafter, an apparatus, in which the afore-mentioned a thin-layer-forming method can be performed, will be described with reference to FIGS. 3A and 3B. FIGS. 3A and 3B are schematic diagrams of apparatus for forming a thin-layer according to example embodiments of the inventive concept.

According to example embodiments shown in FIG. 3A, an apparatus may include a chamber 1000, in which a substrate (or a wafer) can be loaded. In example embodiments, the chamber 1000 may be a single-wafer processing type. In the single-wafer processing type chamber 1000, there may be a vacuum chuck 1100, on which a single semiconductor substrate 100 is loaded, and a showerhead 1200 configured to inject a process gas onto a lower layer in the form of a semiconductor substrate 100. The vacuum chuck 1100 may include a heater configured to heat the semiconductor substrate 100 when a thin-film-forming process is performed.

According to an example embodiment shown in FIG. 3B, the apparatus may be a batch type chamber 1000 configured to be able to load a plurality of semiconductor substrates 100. The batch type chamber 1000 may include an inner tube 1000a of quartz and an outer tube 1000b, and the inner tube 1000b may be shaped like a cylindrical pipe, whose top and bottom are open. A heater (not shown) may be provided around an outer sidewall of the outer tube 1000a to maintain an internal temperature of the chamber 1000 during the thin-film-forming process. For the apparatus of FIG. 3B, a plurality of the semiconductor substrates 100 may be loaded on a boat 1150, and thus, a silicon film forming process can be performed on the plurality of the semiconductor substrates 100.

The apparatus of FIGS. 3A and 3B may include a gas supply line 1010 supplying process gases, which are used to form the thin film. In example embodiments, an organic silicon source supplying portion 1300, an inorganic silicon source supplying portion 1400, and a purge gas supplying portion 1500 may be connected to the chamber 1000 via the gas supply line 1010. At least one gas supply controller may be provided to control operations of supplying the process gases to the chamber 1000.

In example embodiments, the organic silicon source supplying portion 1300 may be configured to supply at least one of the following organic silicon sources (for example, BTBAS, DIPAS, BDEAS, BEMAS, DPAS, DEAS, DMAS, BDMAS, 3DMAS, and 4DMAS) in the form of a gas to the chamber 1000. The inorganic silicon source supplying portion 1400 may be configured to supply at least one of $SiH_4$, $Si_2H_6$, $Si_3H_8$, $SiCl_4$, $SiCl_6$, $SiCl_2H_4$, and DCS ($SiCl_2H_2$) in the form of a gas to the chamber 1000. The purge gas supplying portion 1500 may be configured to supply an inert gas, such as argon (Ar) or nitrogen ($N_2$) to the chamber 1000.

In addition, the chambers 1000 shown in FIGS. 3A and 3B may be connected to an exhaust line 1020 configured to exhaust by-products and residual process gases. The exhaust line 1020 may be connected to a vacuum pump (not shown) controlling an internal pressure of the chambers 1000 during the thin-film-forming process.

Hereinafter, it will be described how the apparatus described with reference to FIGS. 3A and 3B can be used to form a thin silicon film.

In example embodiments, a silicon film 120 may be formed by supplying an organic silicon source as well as an inorganic silicon source into the chamber 1000. In other words, the silicon film 120 may be formed in an in-situ manner.

For example, formation of the silicon film 120 may include supplying the organic silicon source into the chamber 1000, in which the semiconductor substrate 100 is loaded. A purge gas may be supplied into the chamber 1000 before or after the supply of the organic silicon source. As a result of supplying the organic silicon source, silicon seed particles may be chemically adsorbed on the semiconductor substrate 100, as shown in FIG. 2A. Thereafter, the inorganic silicon source may be supplied onto the semiconductor substrate 100, on which the silicon seed particles are adsorbed.

In example embodiments, during the supply of the organic silicon gas, the chamber 1000 may be controlled to have an internal temperature ranging from about 300° C. to about 600° C. and/or a pressure ranging from about 100 Pa to about 150 Pa. In example embodiments, the organic silicon source gas may be supplied into the chamber 1000 for a period of time in a range of about 1 to 3 min.

In example embodiments, while supplying the inorganic silicon gas, the chamber 1000 may be controlled to have an internal temperature that is higher than that for supplying the organic silicon gas. For example, while supply the inorganic silicon gas, the internal temperature of the chamber 1000 may be controlled to be in a range from about 600° C. to 800° C. In example embodiments, a supplying time of the inorganic silicon source may be longer than that for supplying the organic silicon source (for example, about 10 to 30 min).

FIGS. 4 through 8 are sectional views illustrating a method of forming a device isolation structure, in which the thin-film-forming method according to example embodiments of the inventive concept is used.

Figure 4:
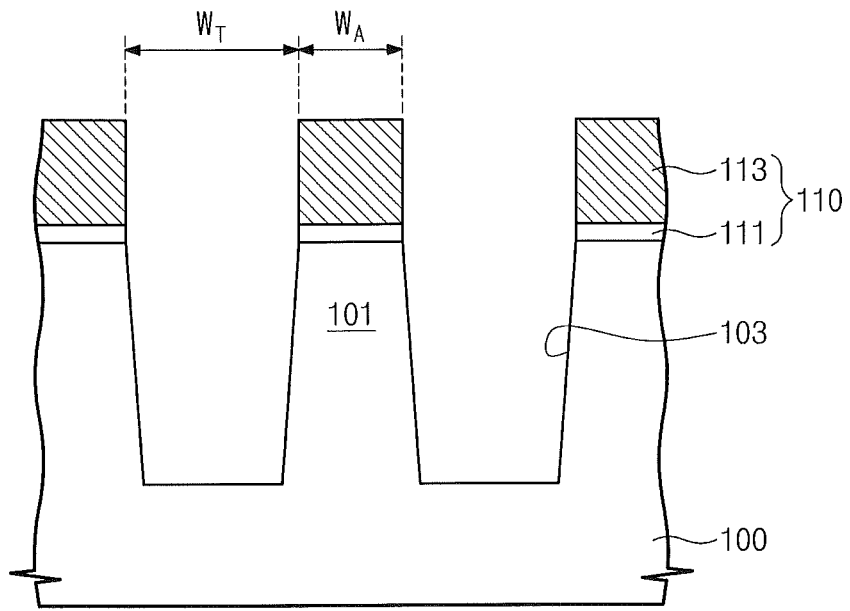
FIGS. 4 through 8 are sectional views illustrating a method of forming a device isolation structure, in which the thin-film forming method according to example embodiments of the inventive concept is used.

Referring to FIG. 4, trenches 103 may be formed in the semiconductor substrate 100 to define active patterns 101. The formation of the trenches 103 may include forming a mask pattern 110 on the semiconductor substrate 100 and etching the semiconductor substrate 100 using the mask pattern 110.

In example embodiments, the semiconductor substrate 100 may be a bulk silicon substrate, a silicon-on-insulator (SOI) substrate, a germanium substrate, a germanium-on-insulator (GOI) substrate, a silicon-germanium substrate, or a substrate epitaxially grown using a selective epitaxial growth (SEG) technique.

The formation of the mask pattern 110 may include sequentially stacking a silicon oxide 111 and a hardmask layer 113 on the semiconductor substrate 100, forming a photoresist pattern (not shown) on the hardmask layer 113 to define an active pattern 101, and then sequentially and anisotropically etching the hardmask layer 113 and the silicon oxide 111 using a photoresist pattern (not shown) as an etch-mask to expose a top surface of the semiconductor substrate 100. After formation of the mask pattern 110, the photoresist pattern (not shown) may be removed. In example embodiments, a thickness of the hardmask layer 113 may vary according to a depth of the trench 103. The presence of the silicon oxide 111 may relieve stress between the semiconductor substrate 100 and the hardmask layer 113, and for example, be formed by thermally oxidizing the semiconductor substrate 100.

Next, the semiconductor substrate 100 may be anisotropically etched using the mask pattern 110 as an etch mask. As a result, the trench 103 defining the active pattern 101 may be formed in the semiconductor substrate 100. The trench 103 may be formed to have a lower width that is less than an upper width (for example, as a result of the anisotropic etching process). For example, the trench 103 may have a downward tapered profile. In addition, the trench 103 may have an aspect ratio of about 2 or more, and the aspect ratio of the trench 103 may increase with an increasing integration degree of the semiconductor device. In example embodiments, an upper width $W_T$ of the trench 103 may be substantially equal to or greater than an upper width $W_A$ of the active pattern 101. In other words, an occupying area of the active pattern 101 may reduce with an increase in an integration degree of the semiconductor device. For example, upper width $W_A$ of the active pattern 101 may range from about 10 nm to about 40 nm.

On a surface of the semiconductor substrate 100 exposed by the trench 103, there may be dangling bonds and defects, which may result from the anisotropic etching process. For example, there may be Si—OH bonds and Si—H bonds on an inner wall of the trench 103.

Figure 5:
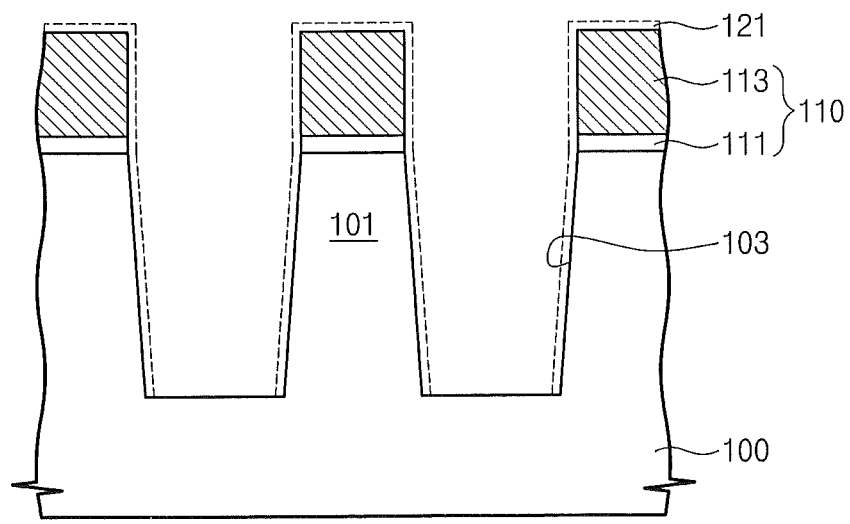

Referring to FIG. 5, a silicon seed layer 121 may be formed on the inner wall of the trench 103.

The silicon seed layer 121 may be formed by chemically adsorbing silicon seed particles on the inner wall of the trench 103 using the organic silicon source described with reference to FIGS. 1B and 2B. In example embodiments, the organic silicon source may be a silicon compound containing an amino group. Alternatively, the organic silicon source material may be a silicon compound containing a hydrocarbon group (CxHy, where x and y are integers greater than or equal to one). In example embodiments, the silicon seed layer 121 may be formed to have a thickness of about 0.1 nm to about 1.0 nm.

In example embodiments, as the aspect ratio of the trench 103 increases, the adsorption of the silicon seed particles on a bottom surface of the trench 103 may be reduced more than on a sidewall of the trench 103. As a result, the silicon seed layer 121 may be selectively formed on the sidewall of the trench 103. Furthermore, the silicon seed layer 121 may be adsorbed on a surface of the mask patterns 110.

Figure 6:
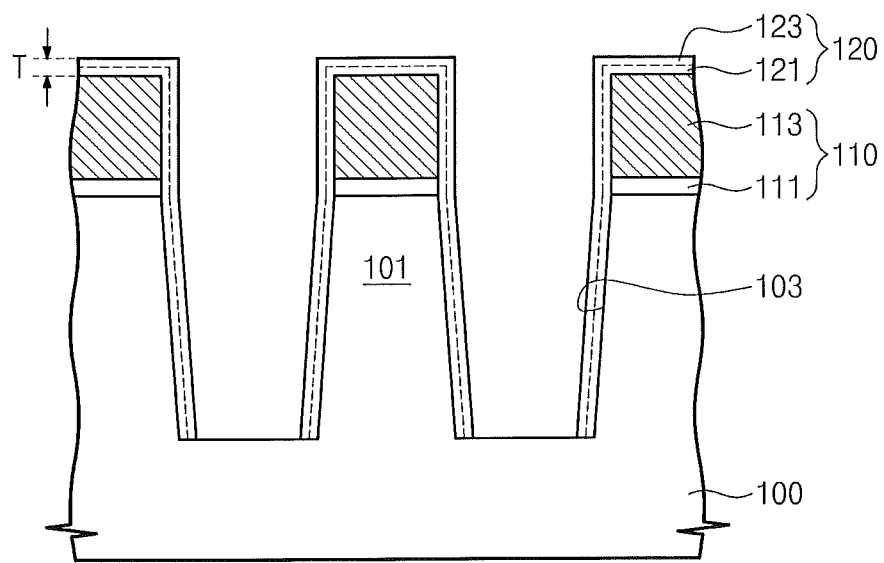

Referring to FIG. 6, a polysilicon film 123 may be deposited on an inner wall of the trench 103 provided with the silicon seed layer 121. The polysilicon film 123 and the silicon seed layer 121 may constitute a silicon film 120 formed on the inner wall of the trench 103.

As described with reference to FIGS. 1C and 2C, the polysilicon film 123 may be deposited using an inorganic silicon source. In example embodiments, the deposition of the polysilicon film 123 may be performed in the same apparatus as that used to form the silicon seed layer 121, in an in-situ manner. The polysilicon film 123 may be formed to have a uniform thickness T ranging from about 1 nm to 10 nm and cover the inner wall of the trench 103. In the case in which the aspect ratio of the trench 103 is high, the polysilicon film 123 may not be deposited on the bottom surface of the trench 103. For example, the polysilicon film 123 may be selectively deposited on the sidewall of the trench 103. In addition, the silicon seed layer 121 may be deposited on a surface of the mask patterns 110. After the formation of the polysilicon film 123, a thermal treatment process may be performed to crystalize the polysilicon film 123 into a single crystalline structure.

Figure 7:
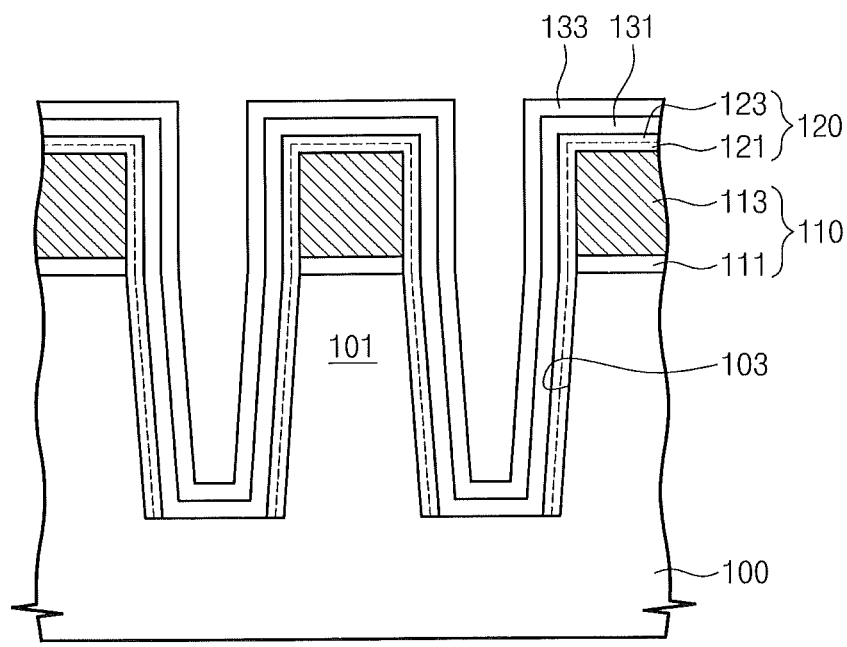

Referring to FIG. 7, an oxide layer liner 131 and a nitride liner 133 may be formed in the trench 103 provided with the silicon film 120.

For example, the oxide layer liner 131 and the nitride liner 133 may be formed to cover conformally the structure provided with the silicon film 120. The oxide layer liner 131 may be formed by a thermal oxidation process. For example, a thermal oxidation process may be performed in a state, in which the inner wall of the trench 103 is exposed outward, by a dry oxidation using $O_2$ or a wet oxidation using $H_2O$.

The presence of the nitride liner 133 may prevent the oxide layer liner 131, which is interposed between an insulating gap-filling layer filling the trench 103 and the silicon film 120, from being expanded or thickened in a subsequent process. The nitride liner 133 may reduce a stress on the inner wall of the trench 103, which may be caused by a volume expansion of the insulating gap-filling layer filling the trench 103.

In example embodiments, the oxide layer liner 131 and the nitride liner 133 may be formed by a deposition method having a good step-coverage property, such as a chemical vapor deposition (CVD) or an atomic layer deposition (ALD).

Figure 8:
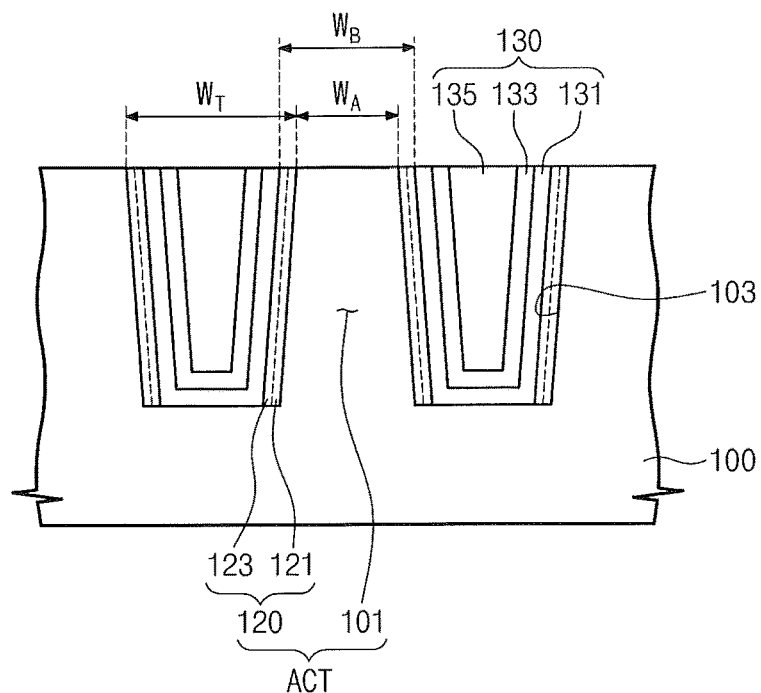

Thereafter, referring to FIG. 8, an insulating gap-filling layer 135 may be formed to fill the trench 103 provided with the oxide and nitride liners 131 and 133. Furthermore, the insulating gap-filling layer 135 may be formed to cover a top surface of the semiconductor substrate 100. In example embodiments, a thermal treatment process may be performed to increase densities of the insulating materials provided in the trench 103, after the formation of the insulating gap-filling layer 135.

The insulating gap-filling layer 135 may be formed of an insulating material having a good gap-filling property, such as boron-phosphor silicate glass (BPSG), high density plasma (HDP) oxide, $O_3$-TEOS, undoped silicate glass (USG), or Tonen SilaZene (TOSZ). Furthermore, the insulating gap-filling layer 135 may be formed using at least one of the thin film forming techniques having a good step-coverage property. For example, the insulating gap-filling layer 135 may be formed using at least one of deposition methods, such as CVD, sub-atmospheric CVD (SA-CVD), low pressure CVD (LP-CVD), plasma enhanced CVD (PE-CVD) or physical vapor deposition (PVD).

Thereafter, subsequent processes may be further performed to planarize the insulating gap-filling layer 135, the oxide and nitride liners 131 and 133, and the silicon film 120, and to remove the mask patterns 110 of FIG. 7.

For example, the planarization may be performed using a chemical-mechanical polishing (CMP) and/or an etch-back process. Accordingly, the silicon film 120 and the oxide and nitride liners 131 and 133 may be removed from a top surface of the mask pattern 110 (e.g., of FIG. 7).

As the result of the removal of the mask pattern 110, a top surface of the active pattern 101 may be exposed. The structure filling the trench 103 may be protruded from a top surface of the semiconductor substrate 100. In example embodiments, a planarization may be performed to planarize the structure filling the trench 103, after removing the mask pattern 110. Accordingly, the trench 103 may be filled with a device isolation structure 130 including the oxide and nitride liners and the insulating gap-filling layer.

Figure 9:
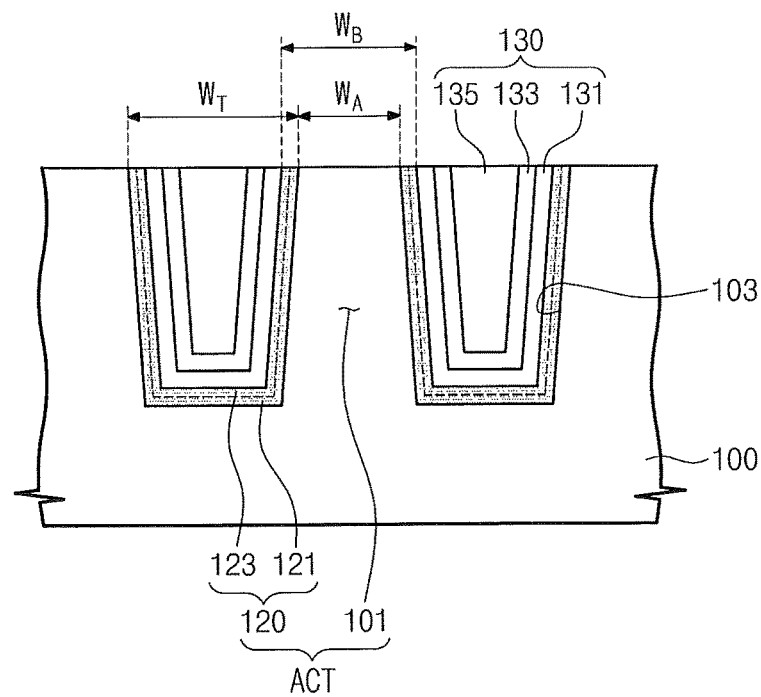
FIG. 9 is a sectional view illustrating a modified method of forming a device isolation structure, in which the thin-film-forming method according to example embodiments of the inventive concept is used.

According to example embodiment shown in FIG. 8, the silicon film 120 may be locally formed between the sidewalls of the device isolation structure 130 and the trench 103. The device isolation structure 130 may be in direct contact with a bottom surface of the semiconductor substrate 100. Alternatively, as shown in FIG. 9, the silicon film 120 may be formed to cover the side and bottom surfaces of the trench 103, and thus the device isolation structure 130 may be spaced apart from the semiconductor substrate 100. In example embodiments, a top surface of the silicon film 120 may be formed to be coplanar with the top surface of the active pattern 101.

In example embodiments, as shown in FIG. 8, the silicon film 120 may be used in conjunction with the active pattern 101 of the semiconductor substrate 100 to constitute an expanded active region ACT. For example, a width $W_B$ of the expanded active region may be substantially equal to the sum of the width $W_A$ of the active pattern 101 and two times the thickness T (in FIG. 6) of the silicon film 120.

FIGS. 10 through 13 are sectional views illustrating an example of a method of fabricating a semiconductor device, in which the thin-film forming method according to example embodiments of the inventive concept is used.

Figure 10:
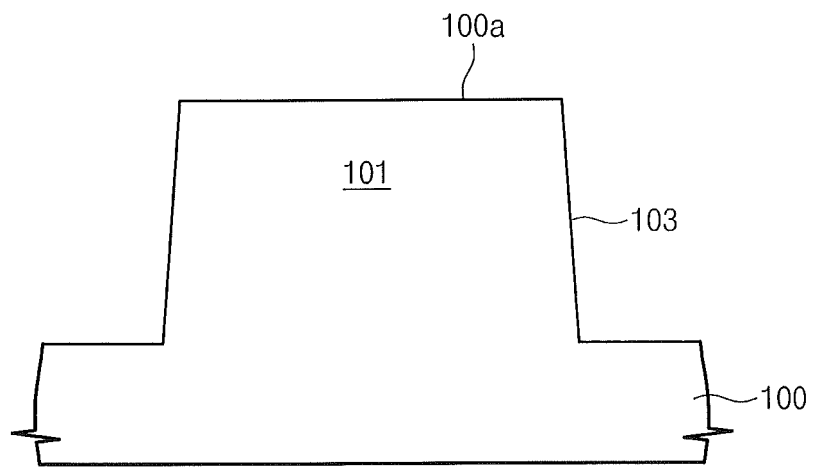
FIGS. 10 through 13 are sectional views illustrating an example of a method of fabricating a semiconductor device, in which the thin-film-forming method according to example embodiments of the inventive concept is used.

Referring to FIG. 10, the semiconductor substrate 100 may be prepared, and then the trenches 103 may be formed to define the active pattern 101 in the semiconductor substrate 100. In example embodiments, a top surface 100a of the semiconductor substrate 100 may be exposed after the formation of the trenches 103.

The formation of the trenches 103 may include forming mask patterns (not shown) on the semiconductor substrate 100 and anisotropically etching the semiconductor substrate 100 using the mask patterns as an etch-mask. The mask patterns may be removed after the formation of trenches 103. In example embodiments, the trenches 103 may be formed to have a lower width that is less than an upper width.

Figure 11:
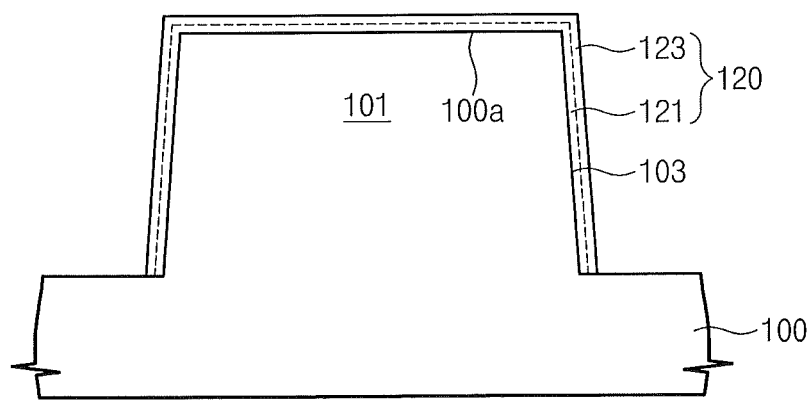

Referring to FIG. 11, the silicon film 120 may be formed to cover the top surface 100a of the semiconductor substrate 100 and inner walls of the trenches 103.

As described with reference to FIGS. 1A through 1D and FIGS. 2A through 2C, the formation of the silicon film 120 may include forming the silicon seed layer 121 on the semiconductor substrate 100 provided with the trench 103 using an organic silicon source, and depositing the polysilicon film 123 using the inorganic silicon source. In example embodiments, the silicon film 120 may be formed to have a thickness ranging from about 1 nm to 10 nm. According to other embodiments, after formation of the polysilicon film 123, a thermal treatment process may be performed to crystalize the polysilicon film 123 into a single crystalline structure.

Figure 12:
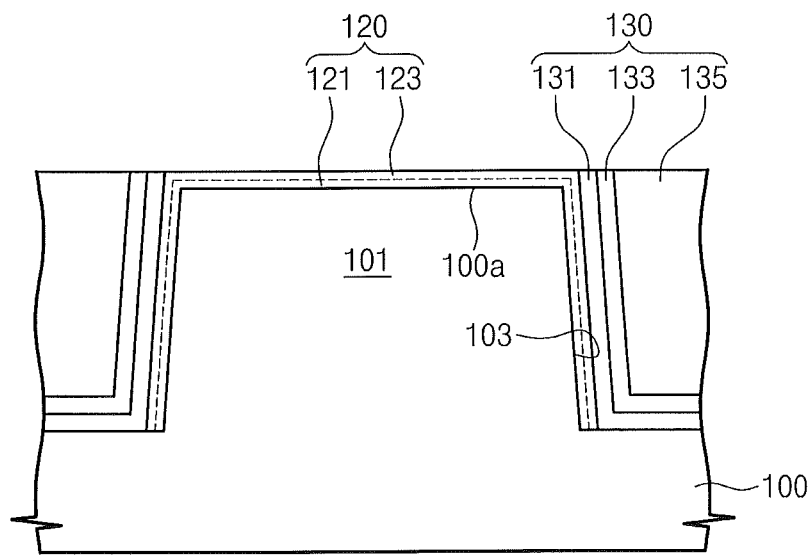

Referring to FIG. 12, the device isolation structure 130 may be formed in the trench 103 provided with the silicon film 120.

In example embodiments, the formation of the device isolation structure 130 may include filling the trench 103 with at least an insulating layer, and performing a planarizing process to expose the top surface of the silicon film 120. For example, the formation of the device isolation structure 130 may include conformally forming the oxide layer liner 131 and the nitride liner 133 on the structure provided with the silicon film 120, and then, forming the insulating gap-filling layer 135 to fill the trenches 103 provided with the liners 131 and 133.

As a result of the formation of the device isolation structure 130, the expanded active region ACT may be formed in the semiconductor substrate 100. The expanded active region ACT may include the active pattern 101 defined by the trench 103 and the silicon film 120 disposed around the active pattern 101. A width of the expanded active region ACT may be substantially equal to the sum of the width of the active pattern 101 and two times the thickness of the silicon film 120.

Figure 13:
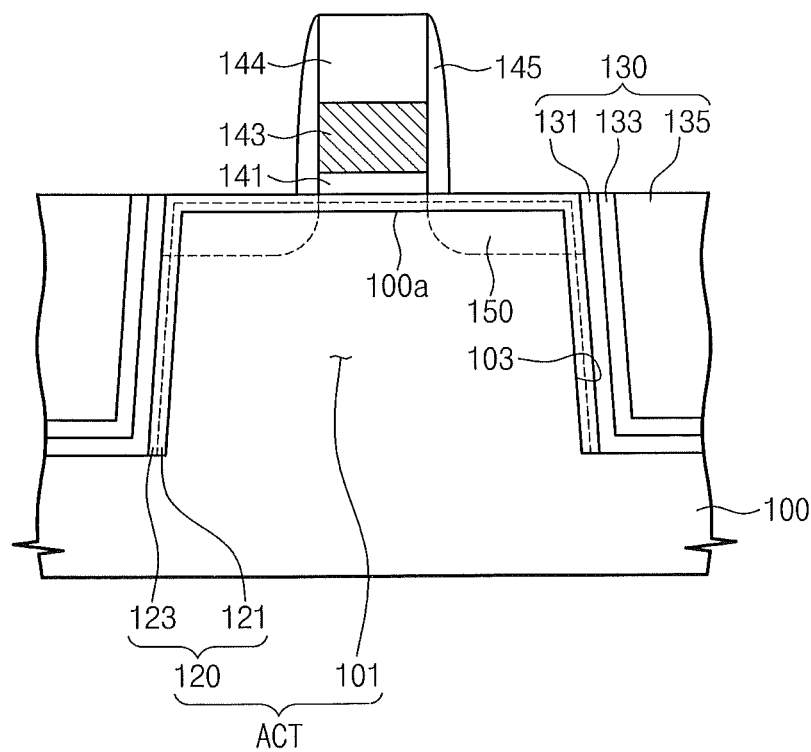

Referring to FIG. 13, a field effect transistor may be formed on the silicon film 120 covering the top surface 100a of the semiconductor substrate 100.

For example, a gate electrode structure may be formed on the silicon film 120, and the gate electrode structure may include a gate insulating layer 141, a gate conductive layer 143 and a hardmask layer 144, which are sequentially stacked. An insulating spacer 145 may be formed on both sidewalls of the gate electrode structure. The gate insulating layer 141 may be formed to include at least one of a thermal oxide layer, a silicon oxide layer, or a silicon oxynitride layer. The gate conductive layer 143 may be formed to include at least one of a polysilicon layer, a metal layer, a metal nitride layer, or a metal silicide layer. The hardmask layer 144 and the insulating spacer 145 may be formed of a silicon nitride layer.

After the formation of the gate electrode structure, source/drain regions 150 may be formed in the expanded active region ACT disposed at both sides of the gate electrode structure. In example embodiments, the source/drain regions 150 may be formed in portions of the silicon film 120 and in the semiconductor substrate 100 by an ion implantation process using the gate electrode structure as an ion mask. In this case, a portion of the silicon film 120 covering the top surface of the semiconductor substrate 100 may serve as a channel region of the field effect transistor.

Hereinafter, it will be described how the thin-film forming method according to example embodiments of the inventive concept can be used to fabricate a semiconductor device. Here, the semiconductor device may include highly integrated semiconductor memory devices (e.g., dynamic random access memory (DRAM) devices, static RAM (SRAM), phase change RAM (PRAM) devices, resistive RAM (RRAM) devices, magnetic RAM (MRAM) devices, ferroelectric RAM (FRAM) devices), or FLASH memory devices, micro electro mechanical system (MEMS) devices, optoelectronic devices, or processors (e.g., CPU or DSP). The semiconductor device may include a plurality of semiconductor components having the same types of operating characteristics. The semiconductor device may be a data processing device, e.g., a system-on-chip (SOC), which includes a plurality of semiconductor components having different types of operating characteristics to realize a specific data processing function.

FIGS. 14 through 19 are diagrams illustrating a semiconductor memory device fabricating method, in which the thin-film forming method according to example embodiments of the inventive concept may be used.

Figure 14:
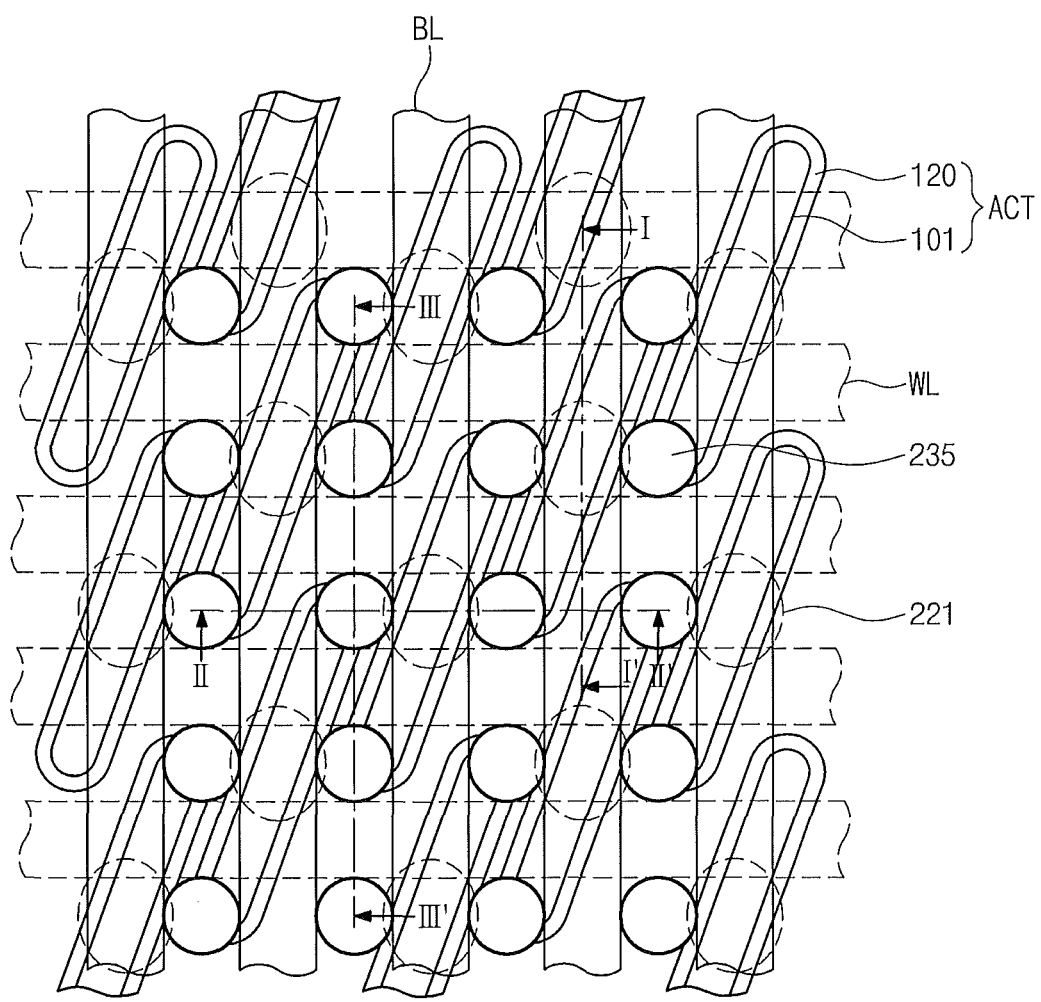
FIGS. 14 through 21 are diagrams illustrating other examples of a method of fabricating a semiconductor device, in which the thin-film-forming method according to example embodiments of the inventive concept is used.

FIG. 14 is a plan view of a semiconductor memory device fabricated by the thin-film forming method according to example embodiments of the inventive concept. FIGS. 15 through 21 are sectional views taken along lines I-I', and of FIG. 14 and show an example of a method of fabricating a semiconductor device, in which the thin-film forming method according to example embodiments of the inventive concept is used.

Figure 15:
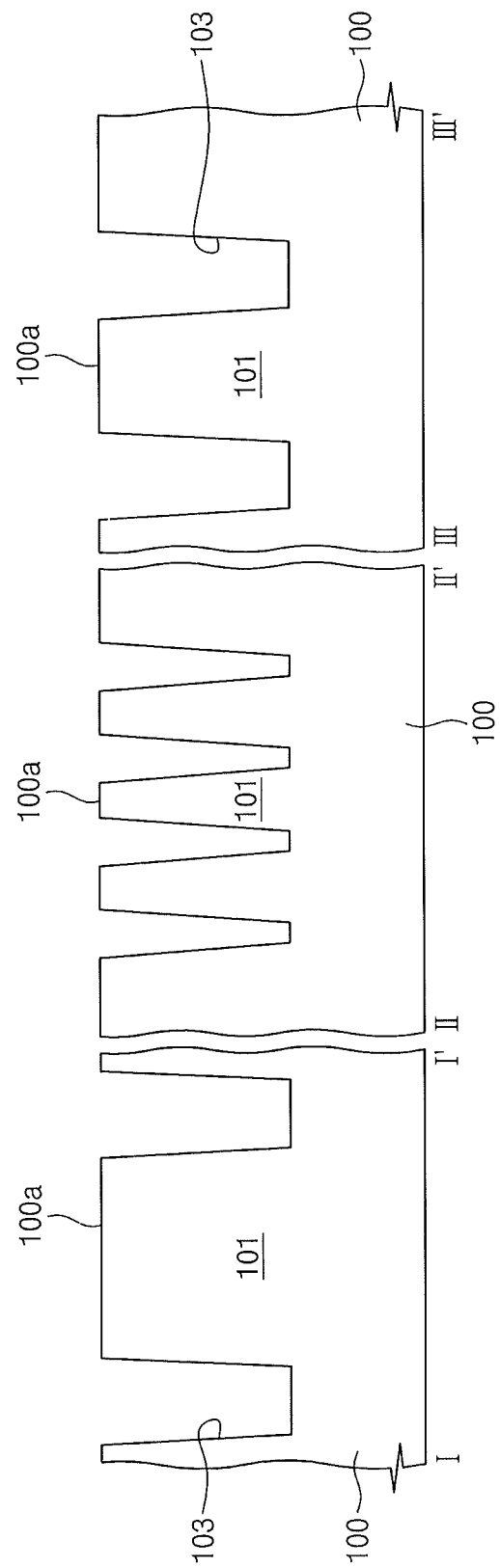

Referring to FIGS. 14 and 15, the trenches 103 may be formed in the semiconductor substrate 100 to define the active patterns 101.

The semiconductor substrate 100 may be a bulk silicon substrate, a silicon-on-insulator (SOI) substrate, a germanium substrate, a germanium-on-insulator (GOI) substrate, a silicon-germanium substrate, or a substrate epitaxially grown using a selective epitaxial growth (SEG) technique.

The formation of the trenches 103 may include forming mask patterns (not shown) on the semiconductor substrate 100, and then anisotropically etching the semiconductor substrate 100 using mask patterns (not shown) as an etchmask. The mask patterns may be removed after the formation of the trenches 103. The trenches 103 may be formed to have a lower width smaller than an upper width. In example embodiments, the minimum width of the trench 103 may be substantially equal to or greater than that of the active pattern 101.

In the meantime, on a surface of the semiconductor substrate 100 exposed by the trench 103, there may be dangling bonds and defects, which may result from the anisotropic etching process. For example, there may be Si—OH bonds and Si—H bonds on an inner wall of the trench 103.

Figure 16:
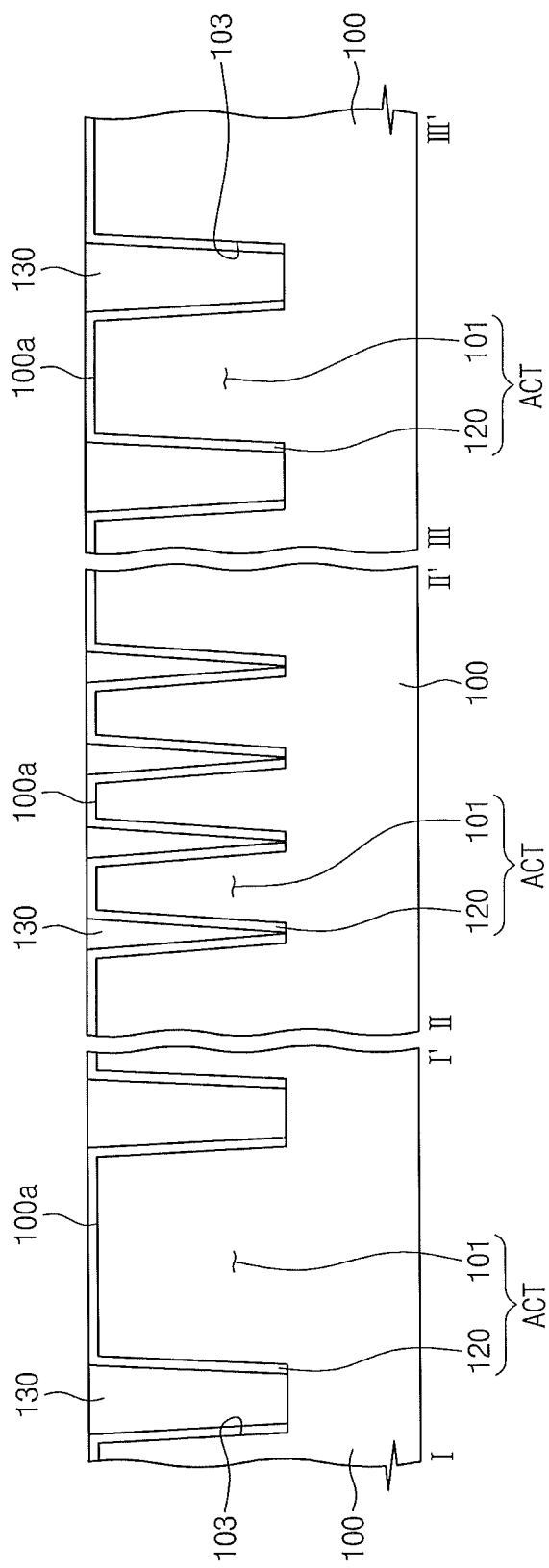
Figure 21:
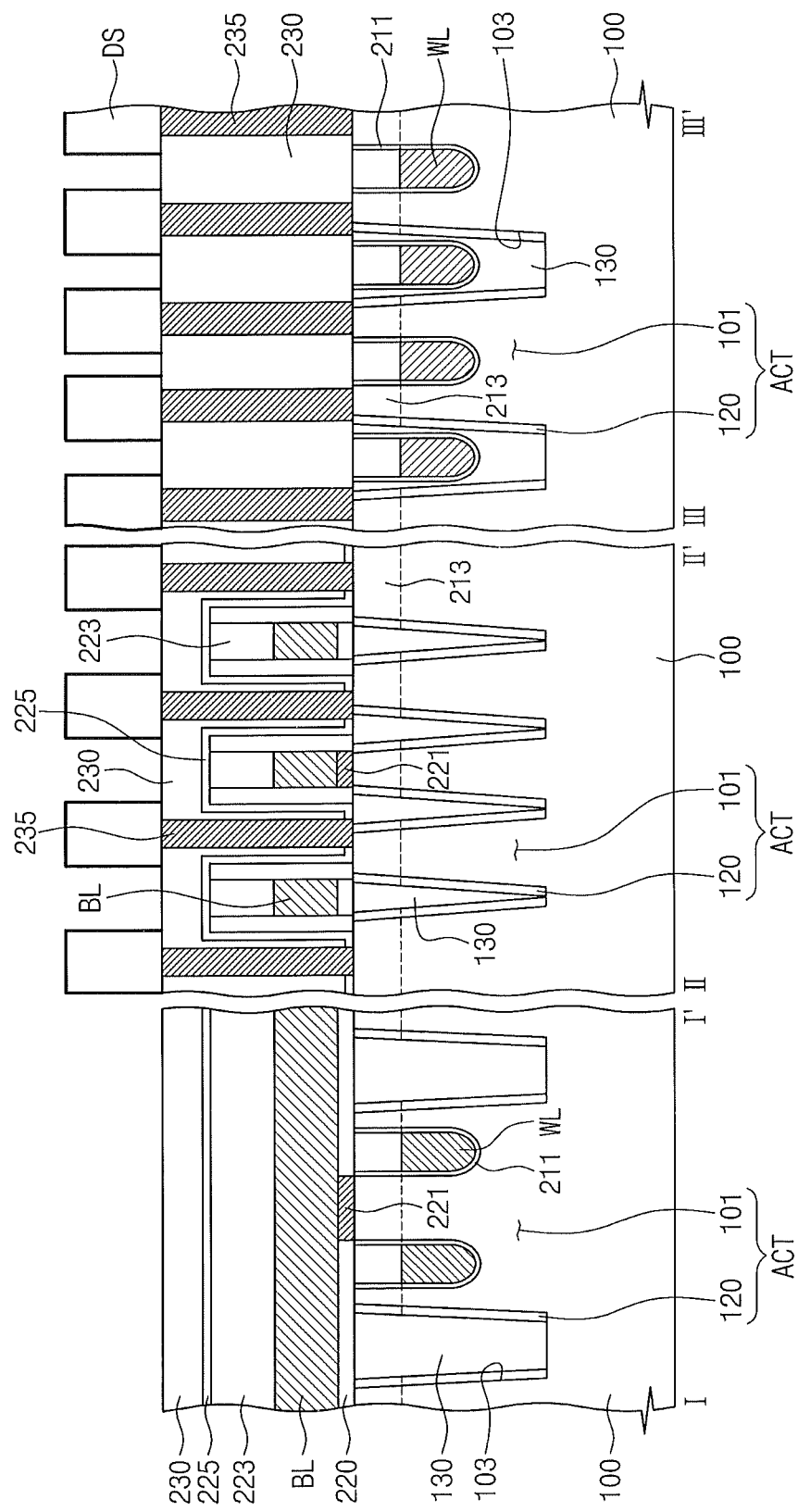

Referring to FIGS. 14 and 16, the device isolation structure 130 may be formed in the trenches 103. In example embodiments, the silicon film 120 may be formed to cover the silicon film 120 in the trench 103, before the formation of the device isolation structure 130. In example embodiments, the silicon film 120 may extend from the inner wall of the trench 103 to the top surface of the semiconductor substrate 100. The silicon film 120 may be selectively formed on the sidewall of the trench 103, and thus, the device isolation structure 130 may be in direct contact with the bottom surface of the device isolation structure 130. Alternatively, the top surface of the semiconductor substrate 100 may be exposed after the formation of the silicon film 120. For example, as shown in FIG. 21, the silicon film 120 may be locally formed on the sidewall of the trench 103, and the uppermost surface of the silicon film 120 may be formed to be coplanar with the top surface of the semiconductor substrate 100.

As described with reference to FIGS. 1A through 1D and FIGS. 2A through 2C, the formation of the silicon film 120 may include forming the silicon seed layer on the semiconductor substrate 100 provided with the trench 103 using an organic silicon source, and depositing the silicon film 120 using the inorganic silicon source. The formation of the seed layer and the deposition of the silicon film 120 may be performed in an in-situ manner.

Since the silicon film 120 is deposited on the silicon seed layer, the silicon film 120 can be formed to a uniformly decreased thickness and have a good thickness uniformity and a good surface property. In example embodiments, the silicon film 120 may have a thickness ranging from about 1 nm to about 10 nm. In addition, the silicon film 120 may have a polycrystalline structure, and after the formation of the silicon film 120, a thermal treatment process may be performed to crystalize the polysilicon film 120 into a single crystalline structure.

Next, the device isolation structure 130 may be formed in the trench 103 provided with the silicon film 120. The device isolation structure 130 may be formed of an insulating material, and liners may be interposed between the device isolation structure 130 and the silicon film 120.

As a result of the formation of the device isolation structure 130, the expanded active region ACT may be defined in the semiconductor substrate 100. The expanded active region ACT may include the active pattern 101 defined by the trench 103 and the silicon film 120 disposed around the active pattern 101. A width of the expanded active region ACT may be substantially equal to the sum of the width of the active pattern 101 and two times the thickness of the silicon film 120. As a result, it is possible to secure an area of the active region, even in the case that an integration density of semiconductor device increases.

Figure 17:
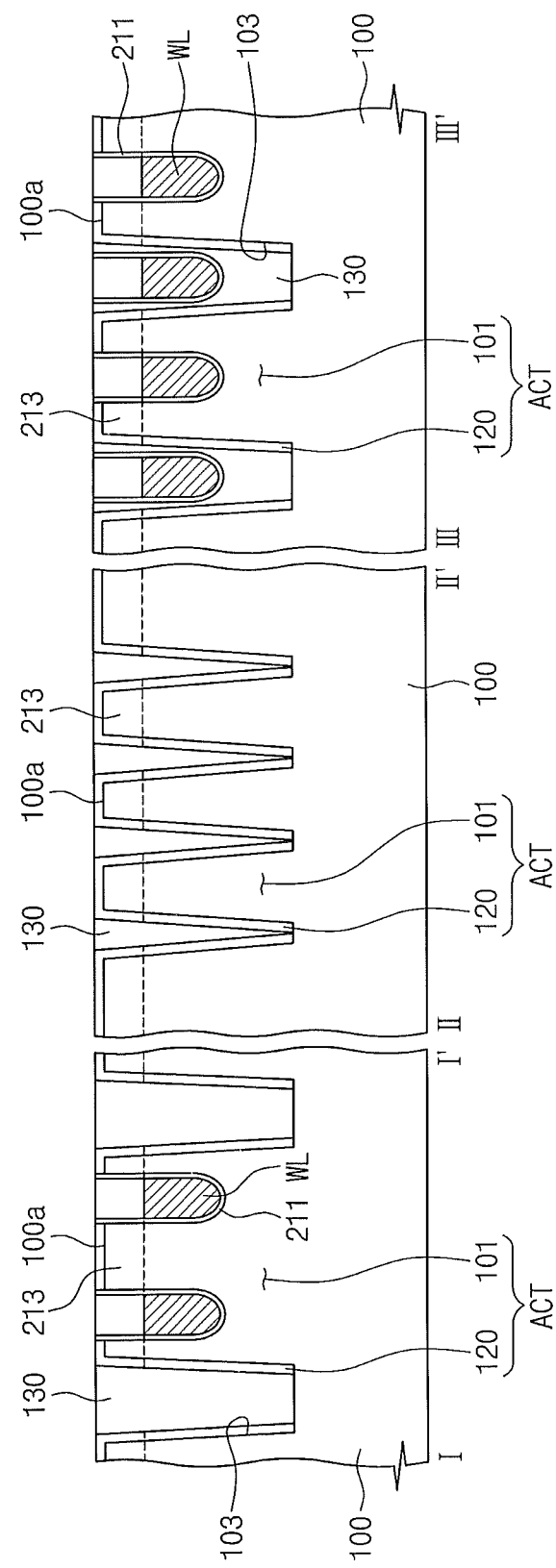

Referring to FIGS. 14 and 17, word lines WL may be buried in the semiconductor substrate 100.

In example embodiments, the formation of the word lines WL may include forming recess regions to cross the expanded active region ACT, forming a gate insulating layer 211 to cover an inner wall of the recess region, and filling the recess region with a conductive layer. Top surfaces of the word lines WL may be positioned at a level lower than that of the semiconductor substrate 100. The recess region provided with the word line WL may be filled with an insulating material.

Source and drain regions 213 may be formed in the expanded active region ACT disposed at both sides of word lines WL. The word lines WL and the source and drain regions 213 may constitute field effect transistors provided in the semiconductor substrate 100. The source and drain regions 213 may be formed by injecting impurities into the active pattern 101 and the silicon film 120.

Figure 18:
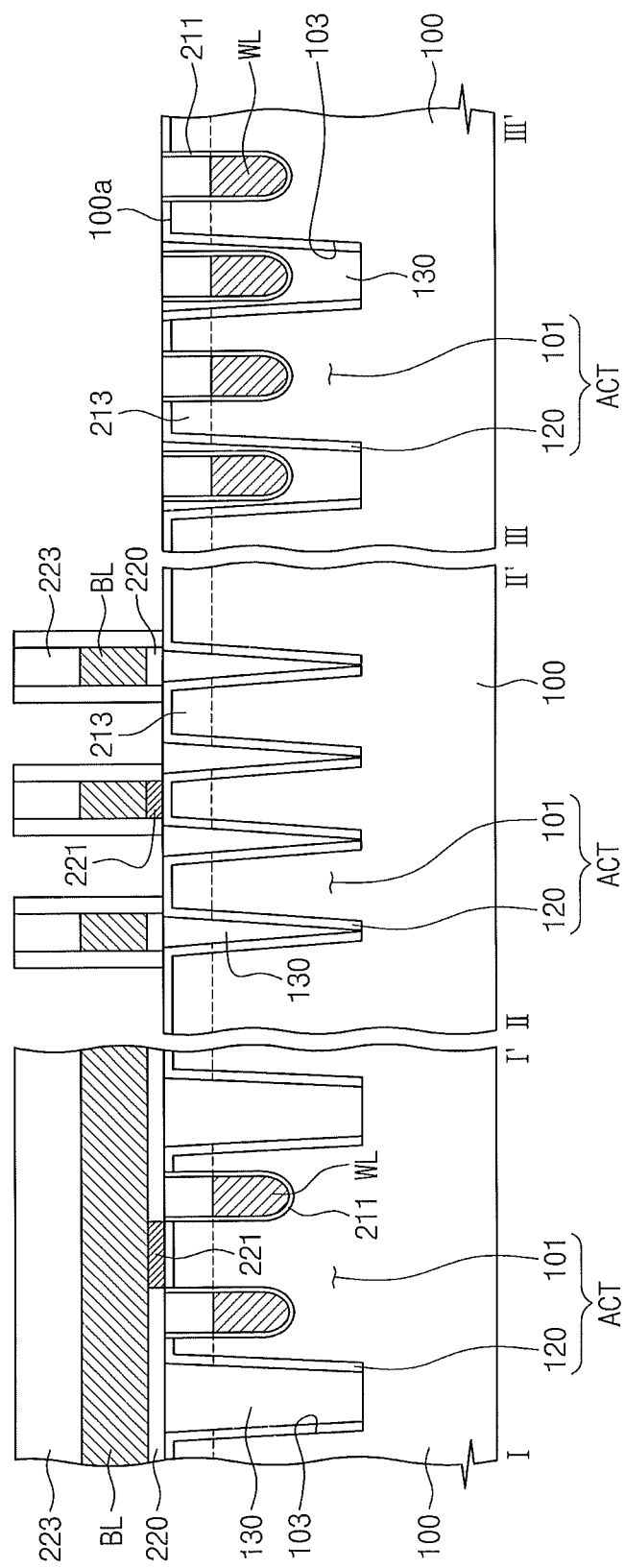

Referring to FIGS. 14 and 18, bit lines BL may be formed on the semiconductor substrate 100 to cross the word lines WL.

In example embodiments, an insulating layer 220 may be interposed between the bit lines BL and the semiconductor substrate 100. A hard mask layer 223 may be provided on the bit lines BL.

Figure 22:
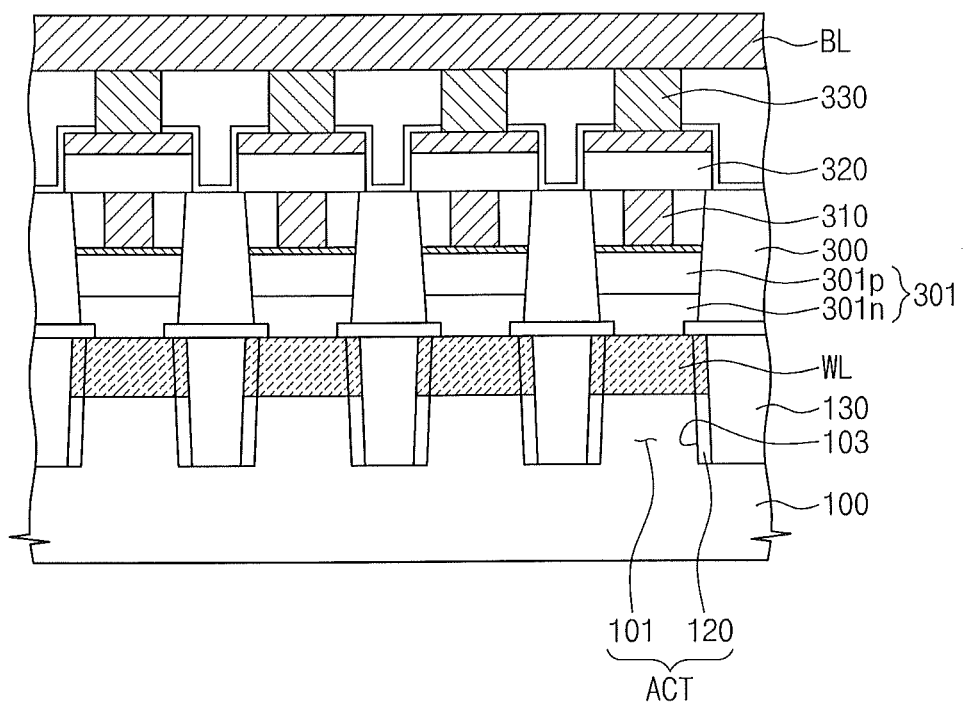
FIG. 22 is a sectional view illustrating an example of a semiconductor memory device fabricated by the thin-film forming method according to example embodiments of the inventive concept.

Conductive patterns 221 may be formed between the expanded active region ACT and the bit line BL to connect electrically the source and drain regions 213 to the bit line BL. The conductive patterns 221 may be formed to be in direct contact with the silicon film 120. Alternatively, as shown in FIG. 22, in the case in which the silicon film 120 is not formed on the top surface of the semiconductor substrate 100, the conductive patterns 221 may be in direct contact with the semiconductor substrate 100.

Figure 19:
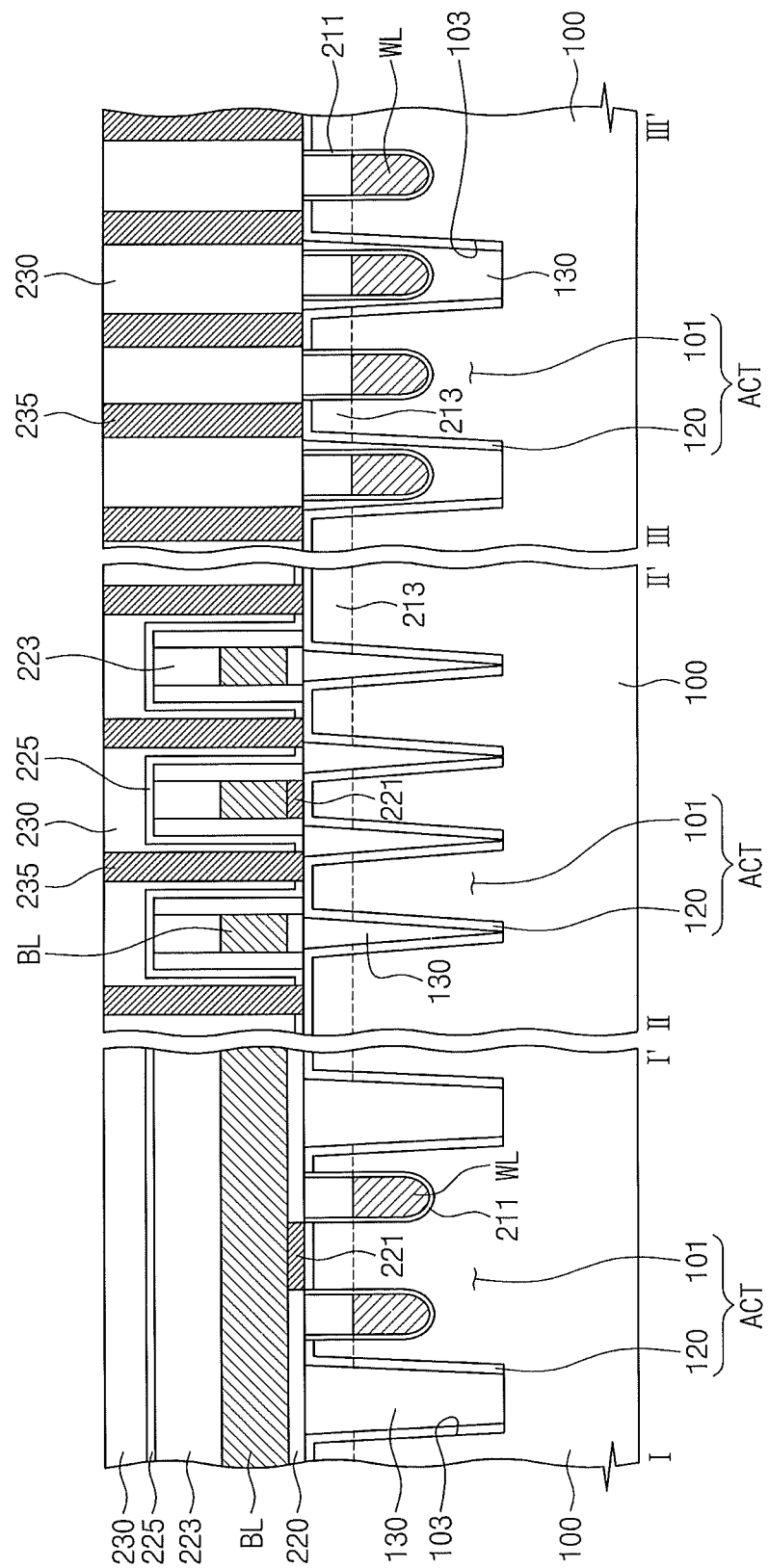

Referring to FIGS. 14 and 19, dielectric interlayer 230 may be formed on the semiconductor substrate 100 to cover the bit lines BL.

The dielectric interlayer 230 may be formed of high density plasma (HDP) oxide, TetraEthyl OrthoSilicate (TEOS), Plasma Enhanced TEOS (PE-TEOS), $O_3$-TEOS, Undoped Silicate Glass (USG), PhosphoSilicate Glass (PSG), Borosilicate Glass (BSG), BoroPhosphoSilicate Glass (BPSG), Fluoride Silicate Glass (FSG), Spin On Glass (SOG), Tonen SilaZene (TOSZ) or any combination thereof. Alternatively, the dielectric interlayer 230 may be formed of at least one of silicon nitride, silicon oxynitride or other low-k dielectric materials.

In example embodiments, before the formation of the dielectric interlayer 230, an etch stop layer 225 may be formed to cover conformally the semiconductor substrate 100 provided with the bit lines BL. The etch stop layer 225 may be formed of a material having an etch selectivity with respect to the dielectric interlayer 230. For example, the etch stop layer 225 may include a silicon nitride layer or a silicon oxynitride layer.

Contact plugs 235 may be formed through the dielectric interlayer 230 and be electrically connected to the source/drain regions 213.

The formation of the contact plugs 235 may include forming contact holes CH through the insulating layer, and filling the contact hole with a conductive material. The contact plug 235 may be formed of a doped polysilicon layer, a metal layer, a metal nitride layer, a metal silicide layer, or any combination thereof. The contact plugs 235 may have a width smaller than line widths of the word lines WL or the bit lines BL.

Figure 20:
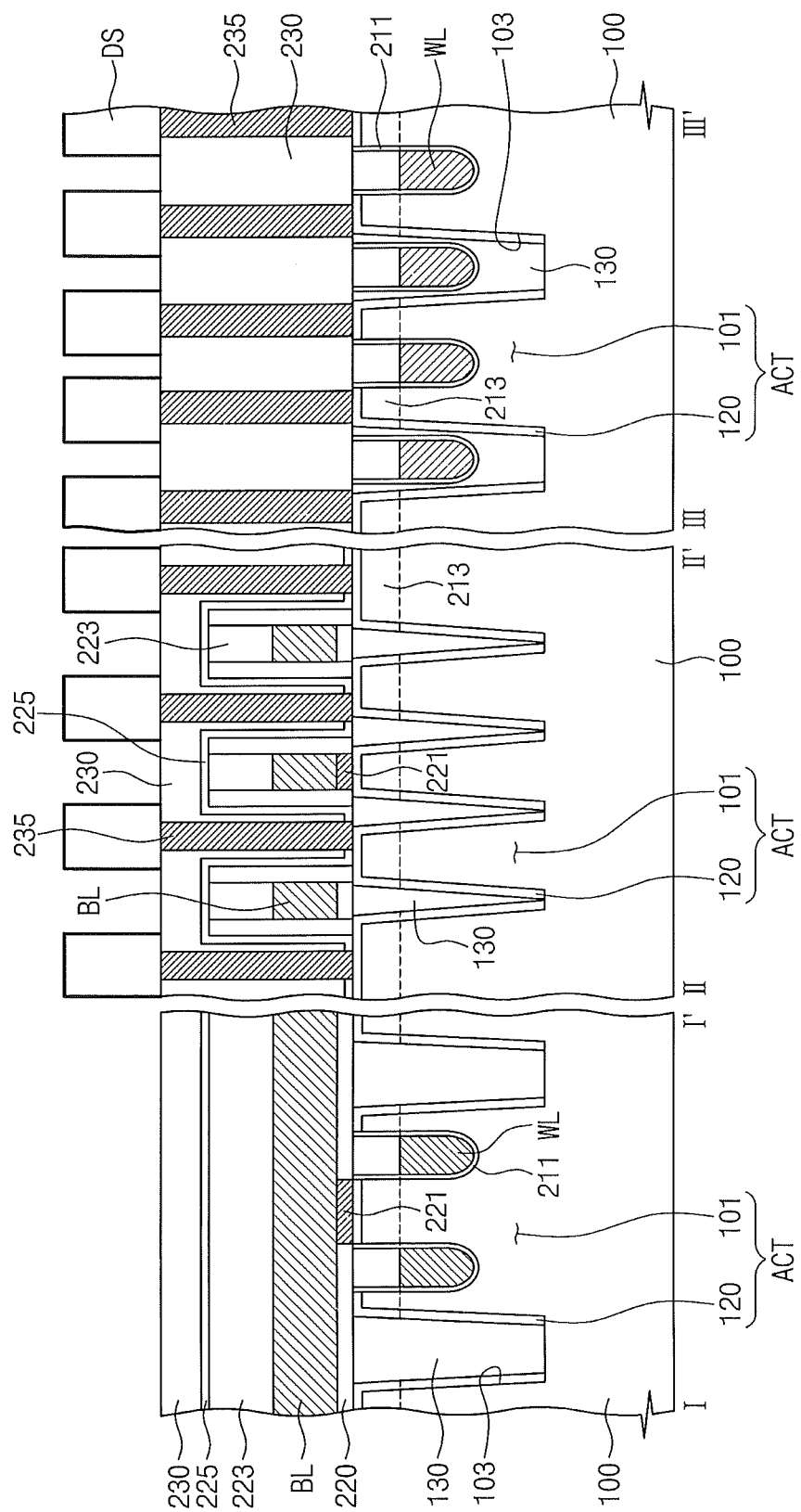

Referring to FIG. 20, data storing elements DS may be formed on the contact plugs 235, respectively. The data storing element DS may be variously modified in structure or type. For example, a capacitor or a variable resistance structure may be used as the data storing element DS.

In the case in which a capacitor is provided as the data storing element DS, the data storing element DS may include a lower electrode, a capacitor dielectric, and an upper electrode. Alternatively, the data storing element DS may be a variable resistance structure configured to have a plurality of stable resistivity levels that are different from each other. For example, the variable resistance structure may include a magnetic tunnel junction structure, a phase changeable material, or a resistive material (for example, including a filamentary conductive path).

FIG. 21 shows another example of a semiconductor memory device fabricated by the thin-film forming method according to example embodiments of the inventive concept.

According to the semiconductor memory device shown in FIG. 21, the silicon film 120 may be locally formed on the sidewall of the trench 103, and the uppermost top surface of the silicon film 120 may be coplanar with the top surface of the semiconductor substrate 100.

FIG. 22 is a sectional view illustrating still another example of a semiconductor memory device fabricated by the thin-film forming method according to example embodiments of the inventive concept.

Referring to FIG. 22, a semiconductor memory device may include a plurality of word lines WL and a plurality of the bit lines BL crossing the word lines WL. Memory cells may be disposed at intersections between the word lines WL and the bit lines BL, respectively. Each of memory cells may include a data storing element 320 and a selection device 301, which may be connected with each other in series. The selection device 301 may be disposed between the data storing element 320 and the word line WL to connect them to each other. As shown, in FIG. 22, the selection device 301 may be provided in a form of a diode 301, but a MOS or bipolar transistor may be used as the selection device 301.

For example, the trenches 103 may be formed in the semiconductor substrate 100 to define the active patterns 101, and then, as described above, the silicon film 120 may be formed to cover the inner wall of the trench 103. The device isolation structures 130 may be formed in the trenches 103 provided with the silicon film 120. Accordingly, as described above, the semiconductor memory device may include the active pattern 101 defined by the trench 103 and the expanded active region ACT including the silicon film 120 provided in the trench 103.

In example embodiments, the word lines WL may be formed in the expanded active region ACT. For example, the word lines WL may be interposed between the device isolation structures 130 disposed adjacent to each other. The word lines WL may be doped regions, which may be formed by doping the semiconductor substrate 100 with impurities. The word lines WL may be formed to have a different conductivity type from the semiconductor substrate 100. For example, in the case in which the semiconductor substrate 100 is a p-type semiconductor, the word lines WL may be formed by highly doping the semiconductor substrate 100 with n-type impurities. Alternatively, the word lines WL may be formed of a metallic material.

A lower insulating layer 300 may be provided on the semiconductor substrate 100 with the word lines WL. Contact holes may be formed through the lower insulating layer 300 to expose top surfaces of the word lines WL, respectively. A diode 301 may be formed in the contact hole. The diode 301 may include an n-type semiconductor layer 301n and a p-type semiconductor layer 301p, which are stacked one over the other on the semiconductor substrate 100. An interface between the n-type and p-type semiconductor layers 301n and 301p may be positioned in the contact hole. In addition, a lower electrode 310 may be formed to connect the diode 301 with the data storing element 320 in the contact hole.

A data storing layer 320 may be formed on the lower electrode 310. The data storing layer 320 may be connected to an upper electrode 330 via the bit line BL crossing the word lines WL. For example, the data storing layer 320 may include a charge trapping material, a phase changeable material, a variable resistance material, or a magnetic material. The phase changeable material may contain at least one of chalcogenide elements (e.g., tellurium (Te) and selenium (Se)). The variable resistance material may be a colossal magneto-resistive material having a perovskite structure, a high-temperature super-conducting (HTSC) material or a transition metal oxide having two or more stable resistance states.

Figure 23:
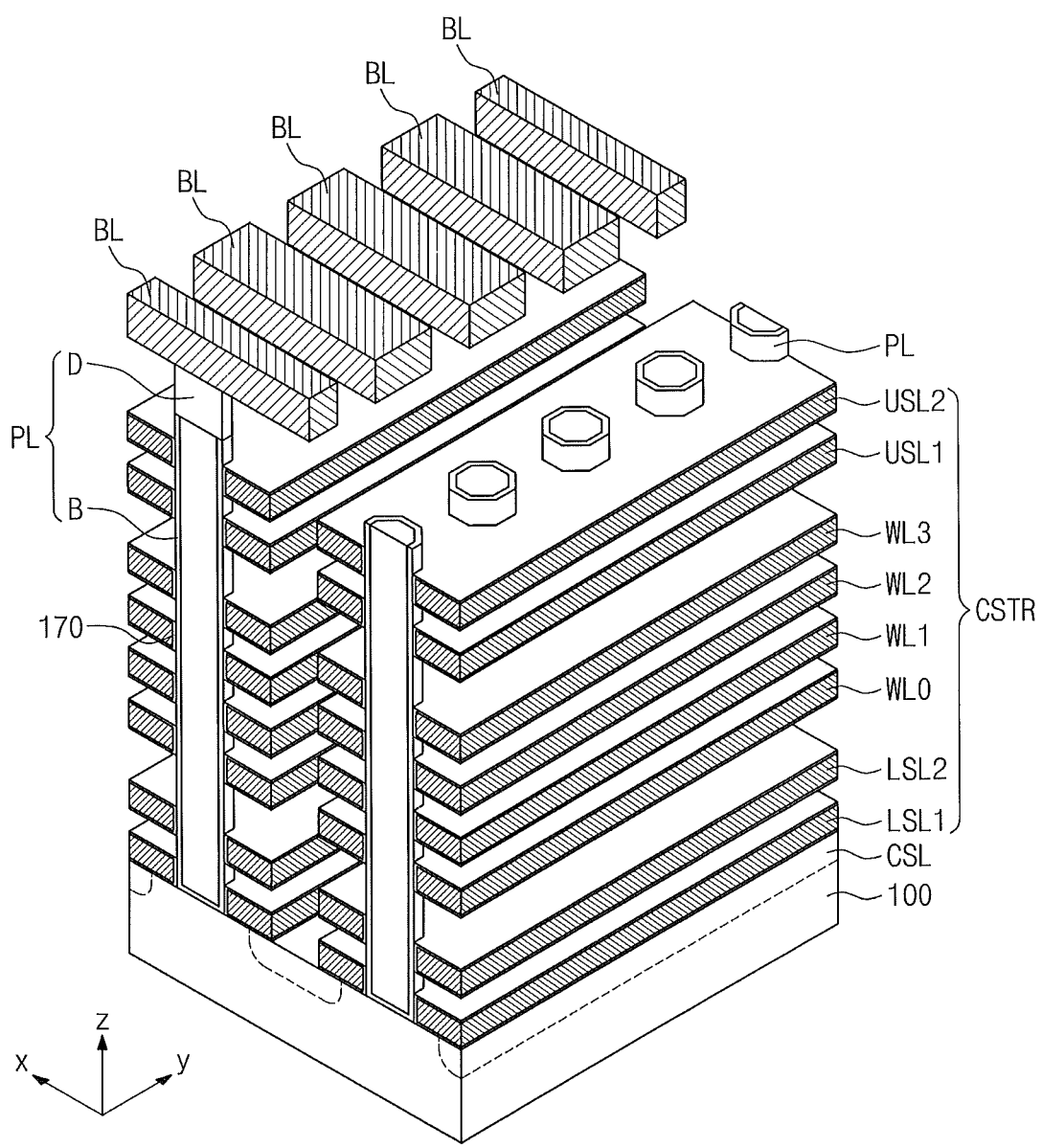
FIG. 23 is a perspective view illustrating a three-dimensional semiconductor memory device fabricated by the thin-film forming method according to example embodiments of the inventive concept.

FIG. 23 is a perspective view illustrating a three-dimensional semiconductor memory device fabricated by the thin-film-forming method according to example embodiments of the inventive concept.

A three-dimensional semiconductor memory device according to example embodiments of the inventive concept may include a common source line CSL, a plurality of the bit lines BL, and a plurality of cell strings CSTR interposed between the common source line CSL and the bit lines BL.

The common source line CSL may be a conductive thin film disposed on the substrate 100 or a doped region formed in the substrate 100. The bit lines BL may be conductive patterns (e.g., of metal) vertically spaced apart from the substrate 100. The bit lines BL may be two-dimensionally arranged on the substrate 100, and the plurality of the cell strings CSTR may be connected in parallel to each of the bit lines BL. Accordingly, the cell strings CSTR may also be arranged on the common source line CSL or the substrate 100 two-dimensionally.

Each of the cell strings CSTR may include a plurality of lower selection lines LSL1 and LSL2, a plurality of the word lines WL0-WL3, and a plurality of upper selection lines USL1 and USL2, which are interposed between the common source line CSL and the bit lines BL. The lower selection lines LSL1 and LSL2, the word lines WL0-WL3 and the upper selection lines USL1 and USL2 may be conductive patterns that are stacked on the substrate 100.

In addition, each of the cell strings CSTR may include a semiconductor pillar PL extending vertically from the common source line CSL to be connected to the corresponding one of the bit lines BL. The semiconductor pillars PL may be formed to penetrate the lower selection lines LSL1 and LSL2, the word lines WL0-WL3 and the upper selection lines USL1 and USL2. In other words, the semiconductor pillars PL may be formed to penetrate the plurality of the conductive patterns stacked on the substrate 100. In addition, the semiconductor pillar PL may include a body portion B and at least one doped region provided in one or both of end portions of the body portion B. For example, a drain region D may be formed in a top portion of the semiconductor pillar PL or between the body portion B and the bit line BL.

The data storing elements DS may be disposed between the word lines WL0-WL3 and the semiconductor pillars PL. In example embodiments, the data storing element DS may be a charge storing layer. For example, the data storing element DS may include one of a trap insulating layer, a floating gate electrode, or an insulating layer containing conductive nanodots.

A dielectric layer serving as a gate insulating layer of a transistor may be provided between the lower selection line LSL1 and LSL2 and the semiconductor pillars PL or between the upper selection lines USL1 and USL2 and the semiconductor pillar PL. The dielectric layer may be formed of the same material as the data storing element DS. For example, the dielectric layer may be a gate insulating layer (e.g., silicon oxide) of a conventional MOSFET.

In this structure, the semiconductor pillars PL may constitute MOS field effect transistors, along with the lower selection lines LSL1 and LSL2, the word lines WL0-WL3, and the upper selection lines USL1 and USL2. For example, the semiconductor pillar PL may serve as a channel region of the MOSFET. Alternatively, the semiconductor pillars PL may constitute MOS capacitors, along with the lower selection lines LSL1 and LSL2, the word lines WL0-WL3, and the upper selection lines USL1 and USL2.

In example embodiments, the lower selection line LSL1 and LSL2, a plurality of the word lines WL0-WL3, and a plurality of the upper selection lines USL1 and USL2 may be used as gate electrodes of selection transistors and cell transistors, respectively. An inversion region may be formed on the semiconductor pillars PL by fringe fields induced from the lower selection lines LSL1 and LSL2, the word lines WL0-WL3, and the upper selection lines USL1 and USL2. The inversion regions in the semiconductor pillars PL may constitute electric current path electrically connecting the common source line CSL with a selected bit line.

In other words, in the cell string CSTR, the lower and upper selection transistors including the lower and upper selection lines LSL1, LSL2, USL1 and USL2 may be connected in series with the cell transistors including the word lines WL0-WL3.

In a three-dimensional semiconductor memory device including the semiconductor pillars PL, the semiconductor pillars PL may be formed using the thin-film forming method according to example embodiments of the inventive concept.

For example, the three-dimensional semiconductor memory device shown in FIG. 23 may be formed by forming a stack on the substrate 100, forming a plurality of contact holes through the stack, and then forming the semiconductor pillars PL in the contact holes. In example embodiments, the stack may include conductive patterns and insulating patterns, which are alternately stacked on the substrate 100. The formation of the semiconductor pillars PL may include a silicon film in the contact hole. For example, as described with reference to FIGS. 1A through 1D and FIGS. 2A through 2C, the formation of the silicon film may include forming a silicon seed layer using organic silicon source, and depositing a polysilicon film using the inorganic silicon source. In example embodiments, the silicon film may be formed to have a thickness ranging from about 1 nm to 10 nm. In other embodiments, after the formation of the polysilicon film, a thermal treatment process may be performed to crystalize the polysilicon film into a single crystalline structure.

According to example embodiments of the inventive concept, it is possible to form a silicon film having a thickness ranging from about 1 nm to 10 nm with improved thickness uniformity and surface morphology.

Furthermore, due to the use of the silicon film forming method, it is possible to increase an area of an active region of a semiconductor device. In other words, to expand an active region in a given area. The expansion of the active region may allow improvement of electrical characteristics (e.g., current property) of a semiconductor memory device.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor device, comprising:
    forming a trench in a semiconductor substrate to define an active region;
    forming a silicon film to be in contact with an inner wall of the trench;
    forming a device isolation structure to fill the trench provided with the silicon film;
    forming a gate electrode to cross the active region; and
    forming source/drain regions in the active region at both sides of the gate electrode,
    wherein forming the silicon film comprises:
    supplying an organic silicon source to form a silicon seed layer directly on the inner wall of the trench; and
    supplying an inorganic silicon source onto the silicon seed layer to deposit a silicon film directly on the inner wall of the trench.

2. The method of claim 1, wherein the silicon film is formed to extend from the inner wall of the trench to a top surface of the semiconductor substrate.

3. The method of claim 2, wherein a portion of the silicon film is disposed between the gate electrode and the top surface of the semiconductor substrate.

4. The method of claim 2, wherein the source/drain regions are formed in portions of the silicon film.

5. The method of claim 1, wherein forming the silicon seed layer is performed at a first temperature, and deposition of the silicon film is performed at a second temperature that is higher than the first temperature.

6. The method of claim 1, wherein forming the silicon seed layer and deposition of the silicon film are performed in an in-situ manner.

7. The method of claim 1, wherein the silicon film is formed to have a poly-crystalline structure.

8. The method of claim 1, wherein the silicon film is subjected to a thermal treatment process to provide a single crystalline structure.

9. The method of claim 1, wherein the device isolation structure is in direct contact with a bottom surface of the trench.

10. The method of claim 1, wherein forming the device isolation structure comprising:
    forming an oxide liner on a surface of the silicon film formed in the trench;
    forming a nitride liner on a surface of the oxide liner; and
    forming an insulating gap-filling layer to fill the trench provided with the silicon film, the oxide liner, and the nitride liner.

11. A method of fabricating a semiconductor device, comprising:

forming a trench in a semiconductor substrate to define an active region;

supplying an organic silicon source to form a silicon seed layer directly on a surface of the semiconductor substrate provided with the trench;

supplying an inorganic silicon source onto the silicon seed layer to deposit a silicon film directly on the surface of the semiconductor substrate provided with the trench; and forming a device isolation structure to fill the trench provided with the silicon film.

12. The method of claim 11, wherein the silicon film is formed to extend from an inner wall of the trench to a top surface of the semiconductor substrate.

13. The method of claim 11, wherein forming the silicon seed layer is performed at a first temperature, and deposition of the silicon film is performed at a second temperature that is higher than the first temperature.

14. The method of claim 11, wherein the device isolation structure is in direct contact with a bottom surface of the trench.

15. The method of claim 11, further comprising:

forming a gate electrode disposed on a portion of the silicon film and crossing the active region;

forming a gate insulating layer disposed between the portion of the silicon film and the gate electrode; and forming source/drain regions in portions of the silicon film at both sides of the gate electrode.

16. A method of fabricating a semiconductor device, comprising:

forming trench in a silicon substrate to define an active region;

forming a silicon film to be in direct contact with a surface of the silicon substrate provided with the trench;

forming a device isolation structure to fill the trench provided with the silicon film;

forming a gate electrode disposed on a portion of the silicon film and crossing the active region; and forming source/drain regions in the active region at both sides of the gate electrode.

17. The method of claim 16, wherein the source/drain regions are formed in portions of the silicon film.

18. The method of claim 16, wherein forming the silicon film comprises:

supplying an organic silicon source to form a silicon seed layer directly on the surface of the silicon substrate provided with the trench; and supplying an inorganic silicon source onto the silicon seed layer to deposit the silicon film directly on the surface of the silicon substrate provided with the trench.

19. The method of claim 18, wherein forming the silicon seed layer is performed at a first temperature, and deposition of the silicon film is performed at a second temperature that is higher than the first temperature.

* * * * *